(12) United States Patent
King et al.

(10) Patent No.: US 10,170,652 B2
(45) Date of Patent: Jan. 1, 2019

(54) METAMORPHIC SOLAR CELL HAVING IMPROVED CURRENT GENERATION

(75) Inventors: Richard R. King, Thousand Oaks, CA (US); Christopher M. Fetzer, Valencia, CA (US); Dimitri D. Krut, Encino, CA (US); Nasser H. Karam, La Canada, CA (US)

(73) Assignee: THE BOEING COMPANY, Chicago, IL (US)

( * ) Notice: Subject to any disclaimer, the term of this patent is extended or adjusted under 35 U.S.C. 154(b) by 237 days.

(21) Appl. No.: 13/069,274

(22) Filed: Mar. 22, 2011

(65) Prior Publication Data
US 2012/0240987 A1  Sep. 27, 2012

(51) Int. Cl.
| H01L 31/00 | (2006.01) |
|---|---|
| H01L 31/0352 | (2006.01) |
| H01L 31/0687 | (2012.01) |
| B82Y 20/00 | (2011.01) |
| H01L 31/0725 | (2012.01) |

(52) U.S. Cl.
CPC ...... H01L 31/035236 (2013.01); B82Y 20/00 (2013.01); H01L 31/0687 (2013.01); H01L 31/0725 (2013.01); Y02E 10/544 (2013.01)

(58) Field of Classification Search
CPC .................. H01L 31/035236; H01L 31/0687
USPC ....................................................... 136/255
See application file for complete search history.

(56) References Cited

U.S. PATENT DOCUMENTS 5,562,345 A  10/1996  Heyman et al.

6,951,819 B2  10/2005  Iles et al.
2003/0089392 A1*  5/2003  Rohr et al. .................... 136/255
2003/0145884 A1  8/2003  King et al.
(Continued)

FOREIGN PATENT DOCUMENTS

| JP | H06-163962 A | 6/1994 |
|---|---|---|
| JP | 06-163962 A | 10/1994 |
| WO | WO 03/100868 A1 | 12/2003 |

OTHER PUBLICATIONS

Wirth, R, Seitz, H, Geiger, M, Porsche, J, Scholz, F & Hangleiter, A, 1998, 'Valence-band splitting and band-gap reduction in ordered GaInAs/InP', Journal of Applied Physics, vol. 83, No. 11, p. 6196.*
Guter et al., Current-matched triple-junction solar cell reaching 41.1% conversion efficiency under concentrated sunlight, Applied Physics Letters 94, 223504 (2009); doi: 10.1063/1.3148341.*
(Continued)

*Primary Examiner* — Angelo Trivisonno
(74) *Attorney, Agent, or Firm* — MH2 Technology Law Group LLP

(57) ABSTRACT

A semiconductor device structure having increased photo-generated current density, and increased current output is disclosed. The device includes low bandgap absorber regions that increase the range of wavelengths at which photogeneration of charge carriers takes place, and for which useful current can be collected. The low bandgap absorber regions may be strain balanced by strain-compensation regions, and the low bandgap absorber regions and strain-compensation regions may be formed from the same ternary semiconductor family. The device may be a solar cell, subcell, or other optoelectronic device with a metamorphic or lattice-mismatched base layer, for which the low bandgap absorber region improves the effective bandgap combination of subcells and current balance within the multijunction cell, for higher efficiency conversion of the solar spectrum.

40 Claims, 16 Drawing Sheets

(56) References Cited

U.S. PATENT DOCUMENTS

| | | |
|---|---|---|
| 2004/0166681 A1 | 8/2004 | Iles et al. |
| 2004/0200523 A1 | 10/2004 | King et al. |
| 2006/0207647 A1 | 9/2006 | Tsakalakos et al. |
| 2006/0266998 A1 | 11/2006 | Vega et al. |
| 2007/0137695 A1* | 6/2007 | Fetzer et al. ............ 136/255 |
| 2007/0137700 A1 | 6/2007 | Sherohman et al. |
| 2007/0175507 A1 | 8/2007 | Dutta |
| 2007/0277873 A1 | 12/2007 | Cornfeld et al. |
| 2008/0251118 A1* | 10/2008 | Rohr et al. ............. 136/255 |
| 2009/0272438 A1* | 11/2009 | Cornfeld ................ 136/261 |
| 2010/0006143 A1 | 1/2010 | Weiser |
| 2010/0047957 A1 | 2/2010 | Kim et al. |
| 2010/0083997 A1 | 4/2010 | Hovel |
| 2010/0218827 A1 | 9/2010 | Aono et al. |
| 2011/0011983 A1 | 1/2011 | King et al. |

OTHER PUBLICATIONS

Norman et al., Structural studies of natural superlattices in group III-V alloy epitaxial layers, Semicond. Sci Technol. 8 (1993) S9-S15; doi:10.1088/0268-1242/8/1S/003.*

Miyamoto et al., GaNAs/GaInAs short-period superlattice quantum well structures grown by MOCVD using TBAs and DMHy, Journal of Crystal Growth 195 (1998) 421-426.*

M.W. Wanlass & A.E. Blakeslee, "Superlattice Cascade Solar Cell", 1982 IEEE, pp. 584-589, Solar Energy Research Institute, Colorado, US.

Annex to Form PCT/ISA/206 Communication Relating to the Results of the Partial International Search, May 2012, 2 pgs.

Japanese Office Action dated May 16, 2017 in Application No. JP 2014-501067, 6 pages.

* cited by examiner

METAMORPHIC SOLAR CELL HAVING IMPROVED CURRENT GENERATION

This disclosure was made with Government support under Contract No. ZAT-4-33624-12 awarded by the U.S. Dept. of Energy (DOE), through the National Renewable Energy Laboratory (NREL). The Government has certain rights in this disclosure.

FIELD

The present disclosure generally relates to optoelectronic devices, and more specifically, to photovoltaic cells having metamorphic semiconductor layers, and to photovoltaic cells having low band-gap absorber regions.

BACKGROUND

A solar cell is a device that is capable of converting sunlight to electrical energy by the photovoltaic effect. A solar cell, such as a multijunction solar cell, can have one or more component photovoltaic cells, also called subcells. These component photovoltaic cells, or subcells, may be connected in series to form a multijunction solar cell, but may also be connected in other electrical configurations, such as in parallel, or in a combination of series and parallel connections.

The interest in solar cells has been increasing due to concerns regarding pollution, energy security, and limited available resources. This interest has been for both terrestrial and space applications. In space applications, solar cells have been in use for more than 40 years and the development of higher efficiency solar cells enables increased payload capabilities. In terrestrial applications, higher solar cell efficiency for conversion of sunlight to electricity results in a smaller collecting area required for a given electrical power output, and therefore lower cost per watt, and greater cost effectiveness for a terrestrial photovoltaic system.

The cost per watt of electrical power generation capacity for photovoltaic systems inhibits their widespread use in terrestrial applications. The conversion efficiency of sunlight to electricity is typically of crucial importance for terrestrial PV systems, since increased efficiency results in a reduction of all area-related electricity generation system components (such as cell area, module or collector area, support structures, and land area) for a required power output of the system. For example, in concentrator solar cell systems which concentrate sunlight from around 2 to around 2000 times onto the solar cell, an increase in efficiency typically results in a reduction of an area comprising expensive concentrating optics. Improvements in solar cell efficiency are extremely leveraging at the system level, and the dollar per watt ($/watt) ratio is a typical figure-of-merit applied at the system level. For satellites, solar panels represent <10% of the entire system cost so that a relative improvement in solar cell efficiency of 3% over an existing technology generation results in leveraged cost savings. The same is true of terrestrial concentrator solar power systems where the cost of the solar receiver is a fraction of the overall system cost.

To increase the electrical power output of such cells, multiple subcells or layers having different energy bandgaps have been stacked so that each subcell or layer can absorb a different part of the wide energy distribution in the sunlight. This arrangement is advantageous, since each photon absorbed in a subcell corresponds to one unit of charge that is collected at the subcell operating voltage, which increases as the bandgap of the semiconductor material of the subcell increases. Since the output power is the product of voltage and current, an ideally efficient solar cell would have a large number of subcells, each absorbing only photons of energy negligibly greater than its bandgap.

Past approaches to increasing photogenerated current density include increasing the thickness of current generating regions for which there is insufficient light absorption above the bandgap. However, in many cases, absorption of light by the solar cell with photon energy above the solar cell bandgap is nearly complete, so increasing the thickness has little effect on the current, or can cause the current to decrease due to poorer collection of photogenerated charge carriers from thicker solar cell layers. Another approach has been to lower the bandgap of the semiconductors used to form the current generating regions of a solar cell, however, this approach also lowers the solar cell voltage. In addition, lowering the bandgap by changing the semiconductor composition often changes the crystal lattice constant, creating a greater lattice mismatch with other layers in the solar cell, which can lead to a higher density of harmful dislocations in the lattice-mismatched subcell.

There exists a need for solar cells and other optoelectronic devices having increased photogenerated current density in a given solar spectrum.

SUMMARY

The present disclosure provides a device structure that increases photogeneration current density for solar cells and other optoelectronic devices. The disclosed devices offer increased efficiency and performance.

In accordance with the disclosure, a lattice mismatched or metamorphic semiconductor device is disclosed that includes a base layer, an emitter layer in electrical connectivity with the base layer, wherein the base layer and emitter layer form a cell, and a low band-gap absorber region disposed in either or both of the base layer and emitter layer.

In accordance with the disclosure, a structure is disclosed that includes one or more low band-gap absorber regions in a base, emitter, or base and emitter of a metamorphic semiconductor device.

In accordance with the disclosure, a method of forming a lattice mismatched or metamorphic semiconductor device is disclosed that includes forming one or more low band-gap absorber regions in a base, emitter, or base and emitter of the semiconductor device.

One advantage of the present disclosure is to increase photogeneration of charge carriers in solar cells and other optoelectronic devices, particularly for devices that rely on weakly absorbing layers due to other design constraints.

Another advantage of the present disclosure is to increase photogenerated current density of a solar cell in a given solar spectrum.

Another advantage of the present disclosure is to minimize absorption of photons by mechanisms that do not result in useful current in order to reduce solar cell temperature under normal operating conditions.

Another advantage of the present disclosure is to increase the energy conversion efficiency of a multijunction solar cell.

Another advantage is to provide a method for tuning the effective bandgap of one or more subcells in a multijunction solar cell while maintaining a given lattice constant in a metamorphic subcell.

Another advantage is to improve the match of the subcell effective bandgap combination to that of the solar spectrum and improve the solar cell efficiency.

Another advantage is reduced thermal load on a cell under operating conditions, and improved tolerance for ionizing radiation environments.

Other features and advantages of the present disclosure will be apparent from the following more detailed description of the preferred embodiment, taken in conjunction with the accompanying drawings, which illustrate, by way of example, the principles of the disclosure. The scope of the disclosure is not, however, limited to this preferred embodiment.

BRIEF DESCRIPTION OF THE DRAWINGS

Wherever possible, the same reference numbers will be used throughout the drawings to represent the same parts.

DETAILED DESCRIPTION

Figure 1:
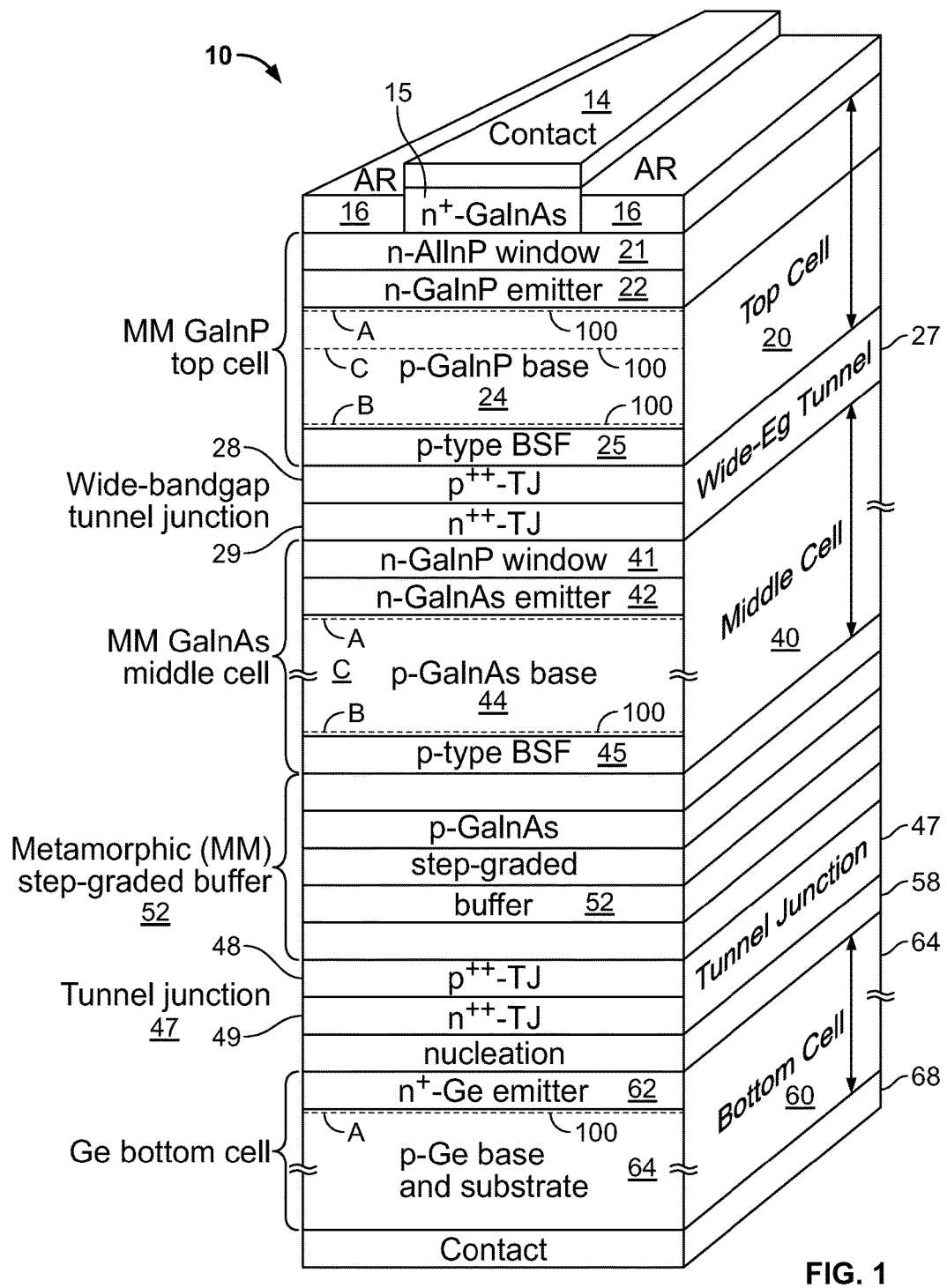
FIG. 1 illustrates a 3-junction, metamorphic solar cell according to an embodiment of the disclosure.

The disclosure describes a semiconductor device structure having increased photogenerated current density. The device structure incorporates low band-gap absorber regions (LBARs) into semiconductor materials to increase photogenerated current density. The semiconductor device structure provides a method to tune the effective band-gap of one or more subcells in a multijunction solar cell while maintaining a given lattice constant in a metamorphic subcell, thereby improving the match of the subcell effective band-gap combination to that of the solar spectrum, and improving the solar cell efficiency. The device structure may be used in metamorphic or lattice-mismatched solar cells and other optoelectronic devices to increase photogeneration.

The present disclosure further describes a high-efficiency multijunction (MJ) photovoltaic (PV) cell, such as, but not limited to a GaInP/Ga(In)As/Ge cell, that may be used with, for example, a terrestrial concentrator photovoltaic (CPV) electricity generation system, of a satellite for use in space. The MJ PV cell incorporates energy wells or low band-gap absorber regions (LBARs) into one or more subcells to increase photogenerated current density.

The LBARs may be incorporated in a space-charge region near a p-n junction; in a space-charge region near an isotype junction formed from materials with the same doping type, but different carrier concentrations and/or different semiconductor compositions (heterojunction); in the quasi-neutral region of the base; and/or in the quasi-neutral region of the emitter of the solar cell.

The LBARs have higher photogeneration by virtue of their lower bandgap than surrounding semiconductor layers, and charge carriers may leave the LBAR by thermal escape, and/or field-assisted escape. Incorporating these LBARs into a solar cell formed from semiconductors composed of two or more chemical elements (ternary, quaternary, etc. semiconductors), referred to here as n>2 semiconductors, such as are found in most metamorphic solar cells, makes it possible to form tensile and compressive regions with respect to the normal solar cell composition and lattice constant within the same semiconductor material, without adding additional elements. The ability to form these regions of alternating smaller and larger lattice constant without adding additional elements avoids the difficulties in composition control and potentially deleterious effects on carrier lifetime that incorporation of additional elements into the crystal lattice can cause, while still allowing a strain-balanced structure—e.g. of multiple pseudomorphic tensile barriers and compressive wells—to be formed to increase the optical thickness and current generating ability of the LBARs without introducing further imperfections or dislocations in the crystal lattice.

The charge carriers may leave the LBARs by thermal escape, and/or field-assisted escape. When the charge carriers can escape the LBARs, and are collected, e.g., at a p-n junction, the LBARs increase the current density of the solar cell. The lower bandgap of the LBARs compared to surrounding semiconductor material allows them to make use of lower energy photons in the incident light spectrum to produce useful current, than the solar cell or other optoelectronic device would otherwise be able to use. When the solar cell is a metamorphic solar cell, the LBARs can extend the response of the device to a wavelength range that would be difficult to reach otherwise, e.g., because it would require a metamorphic solar cell composition with a greater amount of lattice mismatch, and therefore a tendency toward a greater number of dislocations and undesirable carrier recombination centers which lower minority-carrier lifetime and solar cell voltage. Longer wavelength response may also be difficult to achieve in the solar cell without LBARs because of the unavailability of semiconductor materials with high-quality bulk properties for the needed composition with the desired bandgap, or due to the expense of the materials. LBARs in one or more of the subcells of a multijunction cell may be used to increase the current of that subcell beyond that which would be practical, convenient, or cost-effective in a metamorphic solar cell without LBARs, allowing the wavelength responses of the multijunction cell to more closely approximate the ideal division of the solar spectrum for high-efficiency energy conversion. As an embodiment, the LBARs in one or more subcells of a metamorphic multijunction solar cell allow the subcells to have these more nearly ideal spectral responses, and to be current matched in a series-interconnected multijunction cell.

In an embodiment, the LBARs have a bandgap that is lower than that of the semiconductor material elsewhere in the device. In an embodiment, the LBARs have a bandgap lower than that of the bulk of light absorbing material in a solar cell or other optoelectronic device. In an embodiment, the LBARs have a bandgap lower than that of the bulk of light absorbing material in a metamorphic solar cell or other metamorphic optoelectronic device. In an embodiment, the LBARs have a bandgap lower than that of the bulk of light absorbing material in a multijunction solar cell or other multijunction optoelectronic device. In an embodiment, the LBARs have a bandgap lower than that of the bulk of light absorbing material in the base and or emitter of a solar cell or other optoelectronic device. In an embodiment, the LBARs have a bandgap lower than that of layers disposed between the LBARs. In an embodiment, the layers disposed between the LBARs are strain-balance layers, i.e., they balance the strain introduced by the LBARs themselves with strain in the opposite direction. In an embodiment, the LBARs are unstrained with respect the other light absorbing materials in a solar cell or other optoelectronic device. In an embodiment, the LBARs are unstrained with respect to layers disposed between the LBAR layers. In an embodiment, the layers between the LBARs have a smaller material lattice constant than the material lattice constant of the LBARs, where the material lattice constant of a semiconductor is the unstrained lattice constant for that semiconductor composition. In an embodiment, the layers between the LBARs have a bandgap higher than or equal to that of the bulk of light absorbing material in a solar cell or other optoelectronic device.

Incorporating LBARs into a metamorphic solar cell makes it possible to form tensile and compressive regions with respect to the normal cell composition and lattice constant within the same semiconductor material, without adding additional elements. The ability to form these regions of alternating smaller and larger lattice constant without adding additional elements avoids the difficulties in composition control and potentially deleterious effects on carrier lifetime that incorporation additional elements into the crystal lattice can cause, while still allowing a strain-balanced structure of multiple pseudomorphic tensile barriers/compressive wells to be formed, thereby increasing the optical thickness and current generating ability of the LBARs without introducing further imperfections or dislocations in the crystal lattice of the solar cell.

In another embodiment, the LBARs may have size scales small enough that the confined carriers show a change in energy level due to quantum mechanical effects (quantum confinement). In another embodiment, the LBARs may have size scales large enough that the confined carriers have a small or negligible change in energy level. For example, quantum wells, quantum wires, or quantum dots may be used, or in the other extreme, large regions or the entirety of the space charge region, base quasi-neutral region, and/or emitter quasi-neutral region, and combinations thereof, may be of a lower bandgap than the rest of the solar cell, and thereby constitute one or more LBARs in the cell.

In an embodiment, the material bandgap of the LBARs is from 0 to 50 milli-electron volts (meV) less than that of the bulk of light absorbing material in a solar cell or other optoelectronic device, or of the layers between the LBARs. In another embodiment, the material bandgap of the LBARs is from 50 to 150 meV less than that of the bulk of light absorbing material in a solar cell or other optoelectronic device, or of the layers between the LBARs. In yet another embodiment, the material bandgap of the LBARs is from 150 to 300 meV less than that of the bulk of light absorbing material in a solar cell or other optoelectronic device, or of the layers between the LBARs. In still another embodiment, the material bandgap of the LBARs is more than 300 meV lower than that of the bulk of light absorbing material in a solar cell or other optoelectronic device, or of the layers between the LBARs.

The LBARs may have a variety of geometrical configurations, influenced by ease of manufacture, and ability to produce the desired effect of increasing current density of the solar cell or other optoelectronic device. Multiple LBARs may be used in the same solar cell or other device, in order to increase light absorption by the LBARs.

The LBARs may be 2-dimensional (2-D) sheets, 1-dimensional (1-D) linear features, or 0-dimensional (0-D) point-like (dot) features. The LBARs, whether 2-D, 1-D, or 0-D features, may have size scales small enough that the confined carriers show a change in energy level due to quantum mechanical effects (quantum confinement), or may have size scales large enough that the confined carriers have a small or negligible change in energy level. For example, quantum wells (2-D), quantum wires (1-D), or quantum dots (0-D) may be used, or in the other extreme, relatively large regions in comparison to the quantum confinement distance scale, or the entirety of the space charge region, base quasi-neutral region, and/or emitter quasi-neutral region, and combinations thereof, may be of a lower bandgap than the rest of the cell, in a sheet-like (2-D), rod-like (1-D), or granule-like (0-D) configuration in which energy levels are not shifted or are shifted only to a small degree due to quantum mechanical effects.

In one embodiment, the LBARs may take a general 3-dimensional geometrical configuration, with a relatively large spatial extent in all 3 spatial directions. These may be thick layers, or spherical, disk-like, cubic, pyramidal, tetrahedral features, or other 3-dimensional solid figures, including irregular solid shapes. The 3-dimensional LBARs may be continuous thick layers, or may be discontinuous portions of thick layers. They may be oriented in a regular array, a partially-ordered array, or may be distributed randomly. They may be composed of different shapes and have a uniform size or a distribution of sizes. The 3-dimensional LBARs may be formed by self-assembly methods based on the crystal structure of the semiconductor to result in a far more cost-effective means of assembly than by other forms of patterning. These 3-dimensional LBARs may be strained with respect to the solar cell crystal structure, and may be strain-compensated with other 3-dimensional features between the LBARs, or with strain-compensating layers having other geometrical configurations (3-dimensional, 2-dimensional, or 1-dimensional).

In another embodiment, the LBARs may take a general 2-dimensional (sheet-like) geometrical configuration. As with other the geometrical configurations, it is understood that these 2-dimensional features have a much larger spatial extent in 2 dimensions (e.g., the x- and y-directions), and that there is a smaller, but typically finite, spatial extent in the other dimension (e.g., z-direction). These may be planar features, or may be non-planar, such as curved surfaces, or discontinuous sheet-like features. The 2-dimensional LBARs may be formed by self-assembly methods based on the crystal structure of the semiconductor to result in a far more cost-effective means of assembly. These 2-dimensional LBARs may be strained with respect to the solar cell crystal structure, and may be strain-compensated with other 2-dimensional features between the LBARs, or with strain-compensating layers having other geometrical configurations (3-dimensional, 1-dimensional, or 0-dimensional).

In another embodiment, the LBARs may take a general 1-dimensional (line or rod-like) geometrical configuration. As with other the geometrical configurations, it is understood that these 1-dimensional features have a much larger spatial extent in 1 dimensions (e.g., the x-direction), and that there is a smaller, but typically finite, spatial extent in the other dimensions (e.g., y- and z-directions). These may be linear features, or may be non-linear, such as curved lines, or discontinuous line-like features. The 1-dimensional LBARs may be oriented to be parallel to one another, or may be non-parallel, as in a grid of line-like features. The 1-dimensional LBARs may be formed by self-assembly methods based on the crystal structure of the semiconductor to result in a far more cost-effective means of assembly than by other forms of patterning. These 1-dimensional LBARs may be strained with respect to the solar cell crystal structure, and may be strain-compensated with other 1-dimensional features between the LBARs, or with strain-compensating layers having other geometrical configurations (3-dimensional, 2-dimensional, or 0-dimensional).

In another embodiment, the LBARs may take a general 0-dimensional (point-like, or composed of small spheres, disks, cubes or other very small 3-dimensional shapes) geometrical configuration. As with other the geometrical configurations, it is understood that these 0-dimensional features have a small, but typically finite, spatial extent in all 3 spatial dimensions (e.g., x-, y-, and z-directions). These may be spherical, disk-like, cubic, pyramidal, tetrahedral features, or other small 3-dimensional solid figures, including irregular solid shapes. The 0-dimensional LBARs may be oriented in a regular array, a partially-ordered array, or may be distributed randomly. They may be composed of different shapes and have a uniform size or a distribution of sizes. The 0-dimensional LBARs may be formed by self-assembly methods based on the crystal structure of the semiconductor to result in a far more cost-effective means of assembly than by other forms of patterning. These 0-dimensional LBARs may be strained with respect to the solar cell crystal structure, and may be strain-compensated with other 0-dimensional features between the LBARs, or with strain-compensating layers having other geometrical configurations (3-dimensional, 2-dimensional, or 1-dimensional).

The LBARs may be used in one or more subcells within a multijunction solar cell, i.e. a solar cell with 2, 3, 4, 5, 6, or more junctions. Because of the limited availability of semiconductors with the optimum bandgaps to form subcells that will result in the highest multijunction solar cell efficiency, and the limited availability of semiconductors with the desired lattice constants to allow semiconductor crystal growth with a minimum of defects that increase minority-carrier recombination, it is highly desirable to extend the current-producing capability of some subcells to longer wavelengths through the use of these energy wells or LBARs in multijunction cells.

The LBARs may comprise only a limited fraction of the total volume of the solar cell, and hence can be relatively weakly absorbing. These energy wells of LBARs in n>2 materials (materials composed of two or more chemical elements) can be used in conjunction with a reflector built into the back of the solar cell, which reflects some wavelengths back through the energy wells or LBARs for a second (or more) chance to be absorbed and produce useful current. The back surface reflectors used in conjunction with these energy wells or LBARs in n>2 materials may be Bragg reflectors composed of semiconductor materials, Bragg reflectors composed of dielectric materials, or other combinations of semiconductor, dielectric, and/or metal layers.

The optical path of light through a III-V multijunction solar cell can be increased through the use of surface texturing (e.g. from anisotropic etching of the cell surface or the growth substrate surface, or from intentional changes in growth conditions to create a non-planar surface), rough surface morphology (e.g., cross-hatching, or some types of benign haze), reflection from angled facets, or other techniques to trap light within the semiconductor layers by reflection at the solar cell surfaces, including by total internal reflection, creating multiple passes of light through the cell. These surface texturing or light-trapping structures can be used independently or in conjunction with the back surface reflectors and/or energy wells or LBAR structures described above.

In an embodiment, a solar cell or other optoelectronic device is disclosed that includes one or more back-surface reflector structures, in which the back surface reflector, layer beneath the back surface, front surface, and/or layer above the front surface scatter light or deflect light at an angle different from the angle of incidence, in order to 1) increase the optical path length of the light through the photogenerating regions of the device; 2) increase the likelihood of total internal reflection off of the surfaces of the device; and/or 3) cause multiple reflections, or light trapping, within the device, resulting in greater photogeneration of charge carriers. This may be achieved by texturing, roughening, etching with an anisotropic etchant, or otherwise introducing reflective or refractive surfaces or facets on the front or back surfaces of the solar cell directly, by introducing scattering layers beneath the back surface or above the front surface, or by introducing these light scattering or deflection features on the growth substrate before growth of the device.

In an embodiment, a metamorphic solar cell or other optoelectronic device is disclosed, in which one or more of the low bandgap absorber regions for increased photogeneration in the cell is weakly absorbing, such that two or more optical passes through the weakly absorbing cell element augments the photogeneration of charge carriers in the weakly absorbing element. In an embodiment, a metamorphic solar cell or other optoelectronic device is disclosed in which light absorption in the weakly absorbing element is enhanced by a back surface reflector, resulting in greater photogeneration of charge carriers in the solar cell or other device. In another embodiment, a metamorphic solar cell or other optoelectronic device is disclosed in which light absorption in the weakly absorbing element is enhanced by a light scattering element, resulting in greater photogeneration of charge carriers in the solar cell or other device. The light scattering element may be used in conjunction with a back surface reflector. The light scattering element may be the back surface reflector itself, or may include a layer beneath the back surface, front surface, and/or layer above the front surface that scatters light or deflects light at an angle different from the angle of incidence, in order to increase the optical path length of the light through the device, increase the likelihood of total internal reflection, and/or cause multiple reflections, or light trapping.

In an embodiment, a metamorphic solar cell or other optoelectronic device is disclosed that includes epitaxially-grown semiconductor layers which have been removed from a growth substrate, allowing access to the back surface of the device.

In an embodiment, a metamorphic solar cell or other optoelectronic device that includes III-V semiconductor layers and one or more of the current enhancement structures described above is disclosed.

In an embodiment, a solar cell or other optoelectronic device with at least one subcell that is epitaxially grown in an inverted structure and one or more of the current enhancement structures described above is disclosed, where an inverted structure is defined as a structure in which the interface or surface that light strikes first in the final device is grown first (referred to as the front surface of the final device), and the interface or surface that is farthest from the incident light source in the final device is grown last (referred to as the back surface of the final device).

In an embodiment, a solar cell or other optoelectronic device with at least one subcell that is a metamorphic subcell and one or more of the current enhancement structures described above is disclosed, where the at least one subcell is epitaxially grown with a different lattice constant than that of the growth substrate, for which the transition in lattice constant from the growth substrate to the active device occurs in a series of layers with increasing and/or decreasing lattice constant called a metamorphic graded buffer.

In an embodiment, a solar cell or other optoelectronic device with at least one subcell that is a metamorphic subcell and one or more of the current enhancement structures described above is disclosed, for which the metamorphic buffer structure is a metamorphic transparent graded buffer that has high transmittance of wavelengths of light that are used by the active solar cell beneath the transparent graded buffer in the final device configuration.

In an embodiment, a solar cell or other optoelectronic device with at least one subcell that is a metamorphic subcell with a metamorphic transparent graded buffer, and one or more of the current enhancement structures described above, is disclosed, for which the metamorphic subcell is epitaxially grown in an inverted configuration, and for which the multijunction solar cell or other device is bonded to a handle substrate after growth, the growth substrate is removed to allow light to reach the sunward surface (or surface on which light is incident), and front side processing is completed on the solar cell or other device. For example, the cell may be an inverted metamorphic (IMM) multijunction solar cell with 3 to 6 junctions, interconnected in series by tunnel junctions or other types of conductive interface.

In an embodiment, a multijunction solar cell in which at least one of the subcells has strain-balanced low band-gap absorber regions (LBARs) is disclosed. The barrier material and the well material are strain-balanced such that the average lattice constant of the well and barrier material, weighted by their thicknesses, is the same or nearly the same as the lattice constant of other parts of the cell. For example:
1. low-%-In GaInAs barriers and high-%-In GaInAs wells at a lattice constant between that of GaAs and InAs;
2. low-%-In GaInAs barriers and high-%-In GaInAs wells at an InP lattice constant;
3. low-%-In GaInP barriers and high-%-In GaInP wells at a lattice constant between that of GaP and GaAs;
4. low-%-In GaInP barriers and high-%-In GaInP wells at a lattice constant between that of GaAs and InP;
5. Ga(In)(P)As barriers and Ga(In)NAs(Sb) wells at a lattice constant between that of GaAs and InAs;
6. Ga(In)(P)As barriers and Ga(In)NAs(Sb) wells at an InP lattice constant.

In an embodiment, a multijunction solar cell in which at least one of the subcells has unstrained low bandgap absorber regions (LBARs) is disclosed, where the barrier material and the well material are have the same lattice constant but different bandgaps. For example:
1. disordered GaInP barriers and ordered GaInP wells at a lattice constant between that of GaP and InP;
2. high-Al-% AlGa(In)P barriers and low-Al-% AlGa(In)P wells at a lattice constant between that of GaP and InP;
3. high-Al-% AlGa(In)As barriers and low-Al-% AlGa(In)As wells at a lattice constant between that of GaAs and InAs;
4. high-P-% GaInPAs barriers and low-P-% GaInPAs wells at a lattice constant between that of GaAs and InAs;
5. Ga(In)(P)As barriers and Ga(In)NAs(Sb) wells at a lattice constant between that of GaAs and InAs.

In an embodiment, a multijunction solar cell is disclosed in which at least one of the subcells is grown metamorphic, lattice-mismatched to a growth substrate, and has strain-balanced low bandgap absorber regions (LBARs), where the barrier material and the well material are imbedded in a solar cell space-charge region, base, or emitter composed of a semiconductor with 3 or more elements, termed n>2 materials (ternary, quaternary semiconductors, etc.), such that the barrier and well can be formed from the same semiconductor material, i.e., from semiconductors which comprise the same elements, but for which the relative composition of those elements may differ. The barrier and well material can then be formed without the addition of an additional element (e.g. phosphorus) to adjust lattice constant which can lead to reduced composition control, lower crystal quality, and lower minority-carrier lifetime. For example:
1. low-%-In GaInAs barriers and high-%-In GaInAs wells at a lattice constant between that of GaAs and InAs;
2. low-%-Sb GaAsSb barriers and high-%-Sb GaAsSb wells at a lattice constant between that of GaAs and GaSb;
3. high-%-P GaPAs barriers and low-%-P GaPAs wells at a lattice constant between that of GaP and GaAs;
4. low-%-In GaInP barriers and high-%-In GaInP wells at a lattice constant between that of GaP and GaAs;
5. low-%-In GaInP barriers and high-%-In GaInP wells at a lattice constant between that of GaAs and InP.
6. low-%-N (or zero-N) GaInNAs(Sb) barriers and high-%-N GaInNAs(Sb) wells at a lattice constant between that of GaAs and InAs.

A multijunction solar cell grown in which at least one of the subcells is grown metamorphic, lattice-mismatched to a growth substrate is disclosed. The multijunction solar cell has unstrained (lattice-matched) low bandgap absorber regions (LBARs), where the barrier material and the well material are lattice-matched to each other, and imbedded in a solar cell space-charge region, base, or emitter composed of a semiconductor with 3 or more elements, termed n>2 materials (ternary, quaternary semiconductors, etc.), such that the barrier and well material can be formed from the same semiconductor material, i.e., from semiconductors which comprise the same elements, but for which the relative composition of those elements may differ. The barrier and well material can then be formed without the addition of an additional element (e.g. phosphorus) to adjust lattice constant which can lead to reduced composition control, lower crystal quality, and lower minority-carrier lifetime. For example:
1. disordered GaInP barriers and ordered GaInP wells at a lattice constant between that of GaP and InP;
2. high-Al-% AlGa(In)P barriers and low-Al-% AlGa(In)P wells at a lattice constant between that of GaP and InP;
3. high-Al-% AlGa(In)As barriers and low-Al-% AlGa(In)As wells at a lattice constant between that of GaAs and InAs;

4. high-P-% GaInPAs barriers and low-P-% GaInPAs wells at a lattice constant between that of GaP and InAs;
5. low-%-N (or zero-N) GaInNAs(Sb) barriers and high-%-N GaInNAs(Sb) wells at a lattice constant between that of GaAs and InAs.

In an embodiment, a metamorphic solar cell is disclosed. The metamorphic solar cell may be a subcell in a multijunction solar cell that has a back surface reflector (BSR) and/or low bandgap absorber regions (LBARs) in order to extend the wavelength response of photovoltaic cells made from these metamorphic materials at a lower lattice mismatch, thus minimizing the detrimental effects of large lattice mismatch on the cell, such as the formation of electrically-active crystal dislocations and wafer bowing, or to increase the current density, increase the radiation resistance, or decrease the operating temperature of the solar cell. The back surface reflector may be a Bragg reflector formed from semiconductor layers, a Bragg reflector formed from dielectric layers, a metal reflector employed alone, a semiconductor/metal composite reflector, a dielectric/metal composite reflector, a transparent conductive coating/metal composite reflector, or any combination of these materials in a back surface reflector.

In an embodiment, a metamorphic solar cell is disclosed. The metamorphic solar cell may be a subcell in a multijunction solar cell, e.g., metamorphic GaInAs or GaInP cells lattice-mismatched to a Ge substrate, having strain-balanced low bandgap absorber regions (LBARs), where the barrier material and the well material are strain-balanced such that the average lattice constant of the well and barrier material, weighted by their thicknesses, is the same or nearly the same as the lattice constant of other parts of the metamorphic cell, and where the larger average lattice constant of the metamorphic cell allows the choice of more desirable barrier or well materials, e.g., the use of GaAs or low-In % GaInAs as a barrier material in metamorphic GaInAs cells with high-In % GaInAs wells, rather than requiring GaInPAs or other materials with potentially lower minority-carrier diffusion length and lower ability to control composition as the barrier material.

The metamorphic composition of the solar cell base and emitter can allow the strain-compensation layers between the LBAR layers to be composed of a material that is easier to grow, and has longer minority carrier lifetime and transport properties For instance, if the solar cell base is 14%-In GaInAs, the LBARs may be composed of 18%-In GaInAs, and there is ample room to reduce the indium composition in the GaInAs material system to form the small-lattice-constant strain-compensation layers, for instance of 6%-In GaInAs, of a thickness that balances the strain introduced by the higher lattice constant LBARs. In a lattice-matched GaAs subcell in a multijunction solar cell lattice-matched to a GaAs substrate, lattice constants smaller than the GaAs base lattice constant cannot be accommodated in the GaInAs material system, and the small-lattice-constant strain-composition layers must be grown with another material system, such as GaPAs, which can be more difficult to grow with controlled composition, can introduce crystal defects, and can have less desirable minority-carrier properties compared to GaInAs. In a lattice-matched 1%-In GaInAs subcell in a multijunction solar cell lattice-matched to a Ge substrate, the strain-compensation layers can be grown of GaAs, but because there is only a small lattice constant difference between the 1%-In GaInAs solar cell base and GaAs, the GaAs strain-compensation layers must be grown relatively thick, lowering the number of LBARs and the cumulative thickness of LBARs that can be placed in a given region of the solar cell, such as the space-charge region, thus limiting the amount of light the LBARs can absorb, and the photogenerated current density they can produce.

In multijunction solar cells, the combination of bandgaps of the constituent subcells is crucial for efficient conversion of the specific solar spectrum incident on the cell, such as the direct terrestrial solar spectrum, the global terrestrial solar spectrum, or the extraterrestrial (space, or AM0) spectrum. Metamorphic multijunction solar cells change the lattice constant and composition of the subcells in order to achieve a more nearly optimal bandgap combination for solar conversion, for instance by lowering the bandgap of the top two cells in upright metamorphic (MM) 3-junction solar cells, or by raising the bandgap of the bottom cell in inverted metamorphic (IMM) 3-junction solar cells. In upright MM 3-junction, 4-junction, and cells with more junctions, it is often desirable to achieve a higher bandgap top subcell (subcell 1) than that of GaInP at the same, lowered lattice constant of the metamorphic upper subcells. With the use of LBARs in metamorphic subcells, for instance in the metamorphic GaInAs subcell 2 of upright MM 3-junction cells, or in the metamorphic GaInAs subcell 3 of upright MM 4-junction cells, as well as additional examples, the GaInAs subcell can generate increased current density without increasing the lattice constant as much as would be necessary without the use of LBARs in the metamorphic subcell. Thus the top subcell can be grown at this smaller lattice constant and will have a more desirable higher bandgap for GaInP, or AlGaInP of a given Al mole fraction, than in the larger-lattice-constant case with no LBARs in the GaInAs cell.

Moreover, as the lattice constant is increased to larger values in metamorphic solar cells, increasing the lattice mismatch with respect to the growth substrate, there is a greater tendency for dislocations for form in the crystal lattice, which are highly undesirable in the active solar cell regions since they increase minority-carrier recombination, reducing solar cell voltage and current. With the added current density provided by LBARs in metamorphic solar cells, the lattice constant of the subcell need not be increased to as high of a value, resulting in smaller lattice mismatch to the growth substrate, and generally resulting in a lower threading dislocation density, lower minority-carrier recombination rate, and higher solar cell voltage, quantum efficiency, and efficiency.

LBARs in metamorphic cells have these advantages in a variety of metamorphic solar cell types, for instance in ~1.35-eV GaInAs or ~1.2-eV MM subcells in upright MM 3-junction cells, ~1.1-1.2 eV GaInAs MM subcells in upright MM 4-junction cells, ~0.9-1.0 eV GaInAs inverted metamorphic (IMM) subcells in IMM 3-junction cells, ~1.0-1.1 eV GaInAs IMM subcells in IMM 4-junction cells, ~0.7-0.9 eV IMM subcells in IMM 4-junction cells, and subcells with other compositions such as GaInAsSb, AlGaInAs, GaInPAs, AlGaInP, GaInNAs, GaInNAsSb, SiGe, SiGeSn (where the mole fraction of any of the listed elements may be zero if there is another element from the same column of the periodic table present), for a variety of multijunction cell configurations.

Referring now to FIG. 1, a cross-section of a MJ photovoltaic cell (cell) 10 is presented. The cell 10 may be referred to as a 3-junction (3J) solar cell. The cell 10 includes a top subcell 20, a middle subcell 40, and bottom subcell 60, connected in electrical series. The top, middle and bottom subcells 20, 40, 60 may be referred to according to the material of their respective base layers 24, 44, 64, or in other words, as a GaInP subcell 20, a GaInAs subcell 40, and a Ge subcell 60. According to this exemplary embodiment, the cell 10 is composed of a GaInP subcell 20 including a GaInP base layer 24, a Ga(In)As subcell 40 including a Ga(In)As base layer 44 (where the parentheses around In indicates that In is an optional element), and a Ge subcell 60 including a Ge base layer 64. The Ge base layer 64 is formed from a Ge growth substrate, and as such, may be referred to as a Ge base and substrate layer.

In another embodiment, the cell 10 may be formed from group III-V semiconductors, group IV semiconductors, group II-VI semiconductors, group I-III-VI semiconductors, and/or other semiconductor families. In another embodiment, the cell 10 may be formed from semiconductor materials selected from the group including GaAs, GaInAs, GaInP, AlGaAs, AlInAs, AlGaInAs, AlInP, AlGaInP, GaInPAs, AlInPAs, AlGaInPAs, GaPAs, InPAs, AlGaAsSb, AlInAsSb, GaInAsSb, GaAsSb, GaP, InP, AlAs, GaAs, InAs, AlSb, GaSb, InSb, GaNAs, GaInNAs, GaInNPAs, GaInNAsSb, AlGaInN, AlGaN, AlInN, GaInN, AlN, GaN, InN, Ge, Si, SiGe, SiGeSn, SiC.

The top, middle and bottom subcells 20, 40, 60 may also be referred to by the order in which light strikes each subcell as it enters the cell 10. Accordingly, the top subcell 20 may also be referred to as subcell 1, the middle subcell 40 may be referred to as subcell 2, and the bottom subcell 60 as subcell 3. In general, n subcells may be connected in series, where n may be equal to 1 for a single junction cell, or n may be any integer greater than or equal to 2 for a multijunction cell. The growth substrate may be electrically inactive, or, it may be electrically active, thereby forming one of the n subcells in the multijunction cell.

In an embodiment, the cell 10 is a metamorphic (MM) MJ cell and the middle cell 40 is a MM middle cell and the top cell 20 is a MM top cell. In another embodiment, the cell 10 is a MM MJ cell and the middle cell 40 is a GaInAs middle cell and the top cell 20 is a MM GaInP top cell.

In an embodiment, the Ge subcell 60 may be formed from a Ge wafer that serves as a substrate for epitaxial growth of the semiconductor layers that form the upper subcells. The Ge wafer further serves as the main mechanical support for the cell, in addition to serving as one of the three active subcells in cell 10. The epitaxial growth of semiconductor layers on the substrate may be initiated with a nucleation layer 58. The nucleation layer 58 can also serve as a window layer for the Ge subcell 60.

A tunnel junction 47 is formed atop the nucleation layer 58. The tunnel junction 47 includes a $n^{++}$ tunnel layer 48 and a $p^{++}$ tunnel layer 48. The tunnel junction 47 may be formed between the lowermost epitaxial subcell and the above, beneath, or in the body of the metamorphic buffer region 52.

The metamorphic buffer layer 52 includes 5 layers of transitioning lattice constant buffer layers between the bottom subcell 60 and the middle subcell 40. In another embodiment, the metamorphic buffer layer 52 may contain one or more buffer layers. Such growth typically occurs between the nucleation layer 58 and the lowermost epitaxial subcell (such as the middle cell 40).

The bottom and middle subcells 60, 40 are lattice mismatched to one another, i.e., have a different lattice constant from one another. Additionally, the middle and top subcells 40, 20 are lattice mismatched to one another. In an embodiment, the cell 10 is a metamorphic structure. As used herein, the term "lattice matched" means that the lattice constants are within 1% of each other. Also as used herein, the term "lattice mismatched" means the lattice constants are different by more than 1%.

In an embodiment, the lattice constant of adjacent subcells differs by 0.5% or less. In another embodiment, the difference between the lattice constants is in the range between 0.5% and 1.5%. In another embodiment, the difference between the lattice constants is in the range between 1.5% and 2.5%. In yet another embodiment, the difference between the lattice constants is in the range between 2.5% and 4.5%. In still another embodiment, the difference between the lattice constants is greater than 4.5%.

In one embodiment, the lattice constant of adjacent subcells is equal to or is within approximately 0.1% of the lattice constant of GaAs, or 5.6533 angstroms. In another embodiment, the lattice constant of adjacent subcells is equal to or is within approximately 0.1% of the lattice constant of Ge, or 5.6575 angstroms. In another embodiment, the value of the lattice constant of adjacent subcells is equal to or is within approximately 0.1% of the lattice constant of InP, or 5.8688 angstroms. In another embodiment, the value of, the lattice constant of adjacent subcells is equal to or is within approximately 0.1% of the lattice constant of Si, or 5.4307 angstroms. In another embodiment, the value of the lattice constant of adjacent subcells is equal to or is within approximately 0.1% of the lattice constant of GaSb, or 6.09593 angstroms. In another embodiment, the lattice constant of adjacent subcells is equal to or is within approximately 0.1% of that of GaN with a wurtzite crystal lattice structure, characterized by lattice constants of 3.189 angstroms and 5.185 angstroms. In another embodiment, the lattice constant of adjacent subcells is equal to or is within approximately 0.1% of the lattice constant of GaN with a zincblende crystal lattice structure, or 4.50 angstroms. In another embodiment, the lattice constant of adjacent subcells is equal to or is within approximately 0.1% of the lattice constant of InAs, or 6.0584 angstroms. In another embodiment, the lattice constant of adjacent subcells is equal to or is within approximately 0.1% of the lattice constant of InSb, or 6.47937 angstroms. In another embodiment, the lattice constant of adjacent subcells is equal to or is within approximately 0.1% of the lattice constant of CdTe, or 6.482 angstroms.

In this exemplary embodiment, the lattice constant is increasing in the growth direction, or in other words, increasing in the direction from the bottom cell 60 toward the top cell 20 (the lattice constant transition takes place in the metamorphic buffer between the bottom cell and the middle cell). The increase in lattice constant in the growth direction may be referred to as a grade in the compressive direction.

In another embodiment, the lattice constant may decrease in the growth direction, or in other words, decreasing in the direction from the bottom cell 60 toward the top cell 20 (the lattice constant transition takes place in the metamorphic buffer between the bottom cell and the middle cell). The decrease in lattice constant in the growth direction may be referred to as a grade in the tensile direction. In such an embodiment, some material may change, for instance, the middle cell 40 may be GaPAs instead of GaInAs, which allows the middle cell 40 to have a lattice constant smaller than that of GaAs.

The tunnel junction 27 connects the top subcell 20 and the middle subcell 40 in electrical series, and the tunnel junction 47 connects the middle subcell 40 and the bottom subcell 60 in electrical series. In general, each of the n subcells in a MJ cell, such as cell 10, may be connected in series to the adjacent subcell(s) by a tunnel junction in order to form a monolithic, two-terminal, series-interconnected MJ cell. In a two-terminal configuration it can be desirable to design the subcell thicknesses and bandgaps such that each subcell has nearly the same current at the maximum power point of the current-voltage curve of each subcell, in order that one subcell does not severely limit the current of the other subcells. Alternatively, the top, middle and bottom subcells 20, 40, 60 may be contacted by means of additional terminals, for instance, metal contacts to laterally conductive semiconductor layers between the subcells, to form 3-terminal, 4-terminal, and in general, m-terminal MJ cells (m being an integer greater than or equal to 2, and less than or equal to 2n, where n is the number of active subcells in the MJ cell). The top, middle and bottom subcells 20, 40, 60 may be interconnected in circuits using these additional terminals such that most of the available photogenerated current density in each subcell can be used effectively. Such effective use may lead to high efficiency for the cell 10, even if the photogenerated current densities are very different in the various subcells.

A window 21, emitter 22, base 24, and back-surface field (BSF) layer 25 is shown in the top cell 20, a window 41, emitter 42, base 44 and BSF layer 45 are shown in the middle cell 40, and an emitter 62 and base 63 are shown the bottom cell 60.

A variety of different semiconductor materials may be used for the window layers 21, 41, and the buffer layer 52 and the nucleation layer 58. The buffer layer 52 and nucleation layer 58 also serve as window layers for the bottom cell 60. The variety of different semiconductor materials may be used for the window layers 21, 41, and the buffer layer 52 and the nucleation layer 58 may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, Ge, Si, SiGe, ZnSSe, CdSSe, and other materials and still fall within the spirit of the present invention.

The emitter layers 22, 42, 62 may typically be thinner than the corresponding base layers 24, 44, 64 and positioned on the sunward side of the base layers, though some specialized cells also make use of back surface illumination incident on the back of the base. Most of the photogeneration of electron-hole pairs responsible for the cell current typically takes place in the base layers, though the photogenerated current density from the emitter layers 22, 42, 62 can also be significant in most cells, and in some specialized cells may exceed that in the base layers 24, 44, 64.

The emitter layer 62 of the Ge subcell 60 can be formed by diffusion into the p-type Ge substrate of column-V elements (which are n-type dopants in Ge) from the epitaxial growth of the III-V semiconductors on top of the Ge substrate. The base 64 of the Ge subcell 60 consists of the bulk of the p-type Ge wafer which also serves as the growth substrate and mechanical support for the rest of the cell 10. Although, no BSF layer appears on the back of the Ge subcell 60, a BSF layer (such as a diffused p+ region, or an epitaxially-grown group-IV or III-V semiconductor layer) may be positioned in such a location to improve the efficiency of the Ge subcell 60, as well as the overall cell 10 efficiency.

Additionally, while the base layer 64 and growth substrate may preferably be a p-Ge base layer 64 and growth substrate, other semiconductor materials may be used as the base layer 64 and growth substrate, or only as a growth substrate. These include, but are not limited to, GaAs, InP, GaSb, InAs, InSb, GaP, Si, SiGe, SiC, $Al_2O_3$, Mo, stainless steel, soda-lime glass, and $SiO_2$.

The cap layer 15 is disposed upon the top cell 20. The cap layer 15 is a semiconductor layer that forms a low resistance electrical contact to the top surface of the top cell 20, i.e., to the window of the top cell, and also forms a low resistance electrical contact to the metal electrode or grid pattern on the top of the cell, in order for current to be conducted from the top cell to the metal electrode which forms the top electrical terminal of the solar cell with a minimum of resistive power loss. It is typically heavily doped, designated by $n^+$-doping or $p^+$-doping, in order to achieve low contact resistance to the metal electrode. The cap also serves to separate the active top cell layers from the metal layers in the top electrode, which can have deleterious effects if those metals are allowed to diffuse into or otherwise enter the active top cell layers. The cap layer 15 may be a $n^+$-doped GaInAs layer. In other embodiments, the cap layer 15 may be composed of GaAs, GaInAs, GaNAs, GaInNAs, GaAsSb, AlGaAs, AlGaInAs, GaPAs, GaInP, GaInPAs, Ge, SiGe, and other III-V or group-IV semiconductors, and combinations of these materials. In other embodiments, the cap layer 15 may have very high n-type doping, designated $n^+$-doping, or very high p-type doping, designated $p^+$-doping, where very high doping typically indicates doping $>10^{18}$ $cm^{-3}$, and preferably $>10^{19}$ $cm^{-3}$, and more preferably $>10^{20}$ $cm^{-3}$, particularly at the interface with the metal electrode, in order to minimize contact resistance to the metal electrode. In other embodiments, the cap layer 15 may comprise multiple layers, each of which may have a different function in the cap, such a cap comprising a heavily-doped layer near the metal interface and a less heavily-doped layer contacting the top cell window; a cap comprising one or more layers used as a lateral conductance layer; a cap comprising one or more metal diffusion barrier layers; a cap comprising one or more strained layers, e.g., to balance strain elsewhere in the cell, to create strain elsewhere in the cell, or to achieve a lower bandgap to make low resistance contact formation easier; and a cap comprising one or more high bandgap layers or thinned layers to facilitate light transmission through the cap into the solar cell.

The photogenerated current leaves the respective subcell through contacting layers, which are typically heavily-doped semiconductor layers, but may be composed of other types of conductive material, such as conductive oxides or metal, which may be transparent or opaque over different wavelength ranges. The contacting layers for the top subcell 20 are the cap layer 18 on the front of the subcell 20 (which in turn is contacted by the metal grid pattern 14 on the top of the cell 10), and the $p^{++}$-doped side 28 of the tunnel junction 27 on the back surface of the top subcell 20. The contacting layers for the middle subcell 40 are the $n^{++}$-doped side 29 of the tunnel junction 27 on front of the middle subcell 40, and the $p^{++}$-doped side 48 of the tunnel junction 47 on the back surface of the middle subcell 40. The contacting layers for the Ge bottom subcell 60 are the $n^{++}$-doped side 49 of the tunnel junction 47 on front of the buffer region 52 (provided that the buffer region 52 is considered to be part of the window structure for the Ge subcell 60), and the back metal contact 68 on the back surface of the bottom subcell 60 (which can also be considered the back surface of the entire cell 10). These contacting layers may be unpatterned, as in the case of the back metal contact 68 on the bottom subcell 60, or a transparent conductive oxide contacting the top cell window 21 or emitter 22, in place of a more conventional solar cell grid. The contacting layers may also be patterned, as in the case of the patterned heavily-doped cap 18 and metal contact 14 that form the front grid of most solar cells. An anti-reflection coating 16 can be provided on the PV cell's 10 front (sunward) surface (and, for example, disposed above the AlInP window layer 21), and may be typically made up of one, two, or more dielectric layers with thicknesses optimized to maximize transmission of light through the front surface over the range of wavelengths to which the PV cell can be responsive.

The lateral conductivity of the emitter and window layers between gridlines can be important, since after minority carriers in the base (minority electrons in the case of the p-type top cell base 24) are collected at the base/emitter p-n junction between the gridlines, the collected carriers, which are now majority carriers in the emitter (majority electrons in the n-type top cell emitter 22), must be conducted to the gridlines with minimum resistive loss. Both the top cell emitter layer 22 and window layer 21 take part in this lateral majority-carrier conduction to the gridlines. While maintaining this high conductivity, the window 21 and emitter layers 22 should remain highly transmissive to photon energies that can be used effectively by the base 24 of the top cell 20 and by the other active subcells 40, 60 in the cell 10. Further, the window 21 and emitter layers 22 should have a long diffusion length for minority-carriers that are photogenerated in the window 21 and emitter layer 22 (minority holes in the case of the n-type emitter 22), so that they may be collected at the p-n junction before recombining. Since the transmittance and diffusion length both tend to decrease for high doping levels, an optimum doping level typically exists at which cell efficiency can be maximized, for which the conductivity of the window 21 and emitter layer 22 can be high enough that resistive losses are small compared to the power output of the cell 20, and yet the transmittance and minority-carrier collection in the window 21 and emitter layer 22 are high enough that most of the photons incident on the cell 20 generate useful current.

The highly-doped layers that form the tunnel junctions between cells, with their very low sheet resistance, also serve as lateral conduction layers. Such conduction layers help to make the current density across the cell 10 more uniform in the case of spatially non-uniform intensity or spectral content of the light incident on the cell. Laterally-conductive layers between the subcells 20, 40, and on the back of the bottom cell 60, are also very important in the case of MJ cell designs which have more than two terminals. For example, in mechanically-stacked or monolithically-grown MJ cells, with 3, 4, or more terminals, the subcells operate at current densities that are not all necessarily the same in order to optimize the efficiency of each subcell and hence of the entire MJ cell. Laterally-conductive regions between the subcells 20, 40 and at the back of the bottom cell 60 are also important for configurations with 3, 4, or more terminals in which the subcells are interconnected with other circuit elements, such as bypass or blocking diodes, or in which the subcells from one MJ cell are connected with subcells in another MJ cell, in series, in parallel, or in a combination of series and parallel, in order to improve the efficiency, voltage stability, or other performance parameter of the photovoltaic cell circuit.

According to the present disclosure, the cell 10 further includes one or more LBARs 100 (shown as dashed lines). The LBARs 100 have higher photogeneration by virtue of their lower bandgap than surrounding semiconductor material or layers. Charge carriers may leave the LBARs 100 by thermal escape, and/or field-assisted escape. Incorporating the LBARs 100 into the cell 10, or in any solar cell formed from N>2 semiconductors (ternary, quaternary, etc.), makes it possible to form tensile and compressive regions with respect to a prior art solar cell composition and lattice constant within the same semiconductor material, without adding additional elements. The ability to form the LBARs 100 of smaller lattice constant without adding additional elements avoids the difficulties in composition control and potentially deleterious effects on carrier lifetime that incorporation additional elements into the crystal lattice can cause, while still allowing a strain-balanced structure, e.g. of multiple pseudomorphic tensile barriers/compressive wells, to be formed to increase the optical thickness and current generating ability of the LBARs 100 without introducing any further imperfections or dislocations in the crystal lattice.

The LBARs 100 may be 2-dimensional sheets, 1-dimensional linear features, or 0-dimensional point-like (dot) features. The LBARs 100, whether 2-D, 1-D, or 0-D features, may have size scales small enough that the confined carriers show a change in energy level due to quantum mechanical effects (quantum confinement), or may have size scales large enough that the confined carriers have a small or negligible change in energy level. For example, quantum wells, quantum wires, or quantum dots may be used, or in the other extreme, large regions or the entirety of the space charge region, base quasi-neutral region, and/or emitter quasi-neutral region, and combinations thereof, may be of a lower bandgap than the rest of the cell 100.

The LBARs have a bandgap from greater than 0 to about 50 milli-electron volts (meV) less than that of the surrounding semiconductor material. In another embodiment, the LBARs 100 have a bandgap of from about 50 to about 150 meV less than that of the surrounding semiconductor material. In yet another embodiment, the LBARs 100 have a bandgap of from about 150 to 300 meV less than that of the surrounding semiconductor material. In still another embodiment, the LBARs 100 have a bandgap of more than about 300 meV lower than that of the surrounding semiconductor material.

The LBARs 100 may have a volume percent (vol. %) ranging from greater than 0 vol. % to 100 vol. % of the semiconductor layer into which the LBARs 100 are inserted. In another embodiment, the LBARs may be in a range between 10 vol. % to 90 vol. % of the semiconductor layer into which the LBARs are inserted, e.g., the space-charge region of the solar cell. In another embodiment, the LBARs may be in a range from 20 vol. % to 50 vol. % of the semiconductor layer into which the LBARs are inserted. In another embodiment, the LBARs may be in a range from 50 vol. % to 80 vol. % of the semiconductor layer into which the LBARs are inserted.

The LBARs 100 are formed of an active semiconductor material having a lower bandgap than the surrounding semiconductor material. The active semiconductor material may be any one or combination of the semiconductor material discussed above that may be used in a subcell. The LBARs 100 may have a lower bandgap than the surrounding semiconductor material by one or more of the following conditions.

In an embodiment, the LBARs 100 may have a lower bandgap than the surrounding region by using a semiconductor composition that has a lower inherent bandgap than the surrounding semiconductor composition(s). For example, the composition of the semiconductor material surrounding the LBARs may comprise the GaInAs base or GaInAs space-charge region of a metamorphic GaInAs solar cell, and the LBARs may comprise one or more energy wells formed from GaInAs layers with a higher In content and lower bandgap than that of the GaInAs surrounding semiconductor material. Additional examples include GaInAs LBARs in a metamorphic AlGaInAs solar cell base or space-charge region; GaInNAs(Sb) LBARs in a metamorphic GaInAs solar cell base or space-charge region; GaInP LBARs in a metamorphic (Al)GaInP solar cell base or space-charge region; GaPAs LBARs in a metamorphic (Al) GaInP solar cell base or space-charge region; GaInAs LBARs in a metamorphic GaInPAs solar cell base or space-charge region; GaAsSb LBARs in a metamorphic GaInAs solar cell base or space-charge region, and others.

In another embodiment, the LBARs 100 may have a lower bandgap than the surrounding region by ordering the LBAR material differently from the order of the surrounding material. For example, the LBARs may comprise one or more layers of GaInP or AlGaInP with an ordered or partially ordered arrangement of Ga and In atoms on the group-III sublattice of the semiconductor crystal, giving the LBAR layers a lower bandgap than surrounding semiconductor material comprising a disordered or partially disordered GaInP or AlGaInP solar cell base or space-charge region, even when the LBARs and surrounding semiconductor material have identical chemical composition.

In another embodiment, the LBARs 100 may be strain-balanced by layers designated as strain-balance layers or barrier layers between the LBARs. These strain-balance or barrier layers commonly have a bandgap that is higher than the LBAR layers and the semiconductor material surrounding the LBARs and the strain-balance or barrier layers, but may also have a bandgap that is the same as or lower than the LBARs and surrounding material. For example, each LBAR layer of a given thickness and semiconductor composition may be in compressive strain with respect to the bulk of the solar cell as is often encountered when the composition is changed to lower the bandgap, and each strain-balance or barrier layer may be in tensile strain with respect to the bulk of the solar cell, with thickness and composition such that the combination of LBARs and strain-balance layers has zero net strain. This zero, or neutral net strain reduces the driving force for dislocation formation elsewhere in the solar cell. The thickness and composition of the LBARs and strain-balance layers are such that the strained layers remain pseudomorphic, that is the crystal lattice in the LBARs and strain-balance layers does not relax and form dislocations.

In another embodiment, the LBARs 100 and the strain-balance or barrier layers are formed in a metamorphic solar cell base, emitter, or space-charge region, and the LBARs 100 and the strain-balance or barrier layers are formed from the same chemical elements. For example, the LBARs may consist of GaInAs with a high In content and low bandgap, the strain-balance layers may consist of GaInAs with a low In content and higher bandgap, and the strain-balanced combination of LBARs may be placed in a metamorphic solar cell base, emitter, or space-charge region consisting of GaInAs with an intermediate In content and intermediate bandgap value. In other examples, the LBARs and strain-balance layers may consist of GaInAs, AlGaAs, AlGaInAs, GaInP, AlGaInP, GaPAs, InP, InPAs, AlInAs, GaInPAs, GaAsSb, AlGaSb, GaInSb, InAsSb, GaInNAs(Sb), Ge, SiGe, or SiGeSn in a metamorphic solar cell base, emitter, or space-charge region consisting of GaInAs, AlGaAs, AlGaInAs, GaInP, AlGaInP, GaPAs, InP, InPAs, AlInAs, GaInPAs, GaAsSb, AlGaSb, GaInSb, InAsSb, GaInNAs (Sb), Ge, SiGe, or SiGeSn.

In an embodiment, the LBARs 100 may be incorporated into the cell 10 by one or more of the following methods. First, LBARs 100 may be incorporated into the cell 10 by metal organic chemical vapor deposition (MOCVD) to form a 2-D (two-dimensional), 1-D (one-dimensional), or 0-D (zero-dimensional) region of a low bandgap material by using metal organic chemical vapor deposition (MOCVD) to form the region in a space-charge region near a p-n junction, in a space-charge region near isotype junction formed from materials with the same doping type, but different carrier concentrations and/or different semiconductor compositions (heterojunction), in the quasi-neutral region of the base, and/or in the quasi-neutral region of the emitter of the solar cell. For example, an LBAR 100 may be formed as a 2-D sheet of low bandgap material in the space-charge region of the p-n junction formed between GaInAs base 44 and GaInAs emitter 42. In another example, an LBAR 100 may be formed as an array of 1-D rods or wires of low bandgap material in the space-charge region of the p-n junction formed between GaInAs base 44 and GaInAs emitter 42. In another example, an LBAR 100 may be formed as an array of 0-D dots or disks of low bandgap material in the space-charge region of the p-n junction formed between GaInAs base 44 and GaInAs emitter 42. In another example, the 2-D, 1-D, or 0-D LBARs may be formed in the base, emitter, or space-charge region of a metamorphic solar cell with a base comprising a material chosen from, but not limited to, GaInAs, AlGaAs, AlGaInAs, GaInP, AlGaInP, GaPAs, InP, InPAs, AlInAs, GaInPAs, GaAsSb, AlGaSb, GaInSb, InAsSb, GaInNAs(Sb), Ge, SiGe, or SiGeSn.

Additionally, the LBARs 100 and strain-balance or barrier layers may be incorporated into the cell 10 by other deposition methods, such as molecular beam epitaxy (MBE), metal-organic molecular beam epitaxy (MOMBE), vapor phase epitaxy (VPE), liquid-phase epitaxy (LPE), and others.

Additionally, the LBARs 100 and/or strain-balance or barrier layers may be formed in a 2-D, 1-D, or 0-D LBAR structures by self assembly of the deposited atoms on the growth surface into these geometric configurations, for example, driven by the interactions of chemical bonds between atoms and the effect of the crystal lattice of the growing surface serving as a template for atomic self assembly into larger 2-D, 1-D, or 0-D LBAR structures. The 2-D, 1-D, or 1-D LBAR structures may also be formed by other patterning methods, such as lithography, micro-stamping or micro-printing methods including intaglio microprinting, electron-beam patterning, and others.

The LBARs 100 may be incorporated in the cell 10 into one or more positions including one or more first locations A corresponding to space charge regions at a p-n junction, one or more second locations B corresponding to the space-charge region near an isotype junction formed from materials of the same doping type but different carrier concentrations and/or different semiconductor compositions (heterojunctions), one or more third locations C corresponding to the quasi-neutral region of a base or emitter, and one or more fourth locations D corresponding to in the quasi-neutral region of an emitter.

In an embodiment, LBARs 100 may be incorporated in the cell 10 into one or more first locations A corresponding to space-charge regions at a p-n junction. In an embodiment, LBARs 100 are disposed near a p-n junction in a solar cell to assist in the collection of photogenerated charge carriers that are escape from the LBARs 100. In another embodiment, LBARs 100 are disposed in the space-charge region of a p-n junction in a solar cell, where the electric field can assist escape of charge carriers from the LBARs and assist collection of the charge carriers. For example, LBARs 100 may be incorporated into the space charge region formed at the junction of GaInAs base 44 and GaInAs emitter 42. In an embodiment, LBARs 100 may be incorporated into a space-charge region existing in the GaInAs base 44 within greater than 0 up to 1 micron from the interface between the GaInAs base 44 and GaInAs emitter 42. In another embodiment, the LBARs 100 may be incorporated into a space-charge region existing in the GaInAs emitter 42 within greater than 0 up to 1 micron from the interface between the GaInAs base 44 and GaInAs emitter 42. In another embodiment, LBARs 100 may be incorporated at the interface between the GaInAs base 44 and GaInAs emitter 42. In another embodiment, LBARs 100 may be incorporated into a space-charge region existing in the GaInP base 24 within greater than 0 up to 1 micron from the interface between the GaInP base 24 and GaInP emitter 22. In another embodiment, the LBARs 100 may be incorporated into a space-charge region existing in the GaInP emitter 22 within greater than 0 up to 1 micron from the interface between the GaInP base 24 and GaInP emitter 22. In another embodiment, LBARs 100 may be incorporated at the interface between the GaInP base 24 and GaInAs emitter 22. In another embodiment, the solar cell containing an emitter, base, window, back-surface field (BSF) layer, LBARs, and/or strained or barrier layers may be a lattice-matched solar cell having a lattice-constant that is the same or nearly the same as that of the growth substrate. In another embodiment, the solar cell containing an emitter, base, window, BSF layer, LBARs, and/or strained or barrier layers may be a metamorphic solar cell having a lattice-constant that is substantially different than that of the growth substrate, where substantially different indicates a lattice mismatch greater than about 0.05%, and typically in a range from about 0.1% to about 4.0%. In another embodiment, the solar cell containing an emitter, base, window, BSF layer, LBARs, and/or strained or barrier layers may be a subcell in a multijunction solar cell, where the LBARs help to tune the wavelength response of the subcell within the multijunction stack to convert the solar spectrum more efficiently.

In another embodiment, LBARs 100 may be incorporated into one or more second locations B corresponding to the space-charge region or quasi-neutral region near an isotype junction formed from materials of the same doping type but different carrier concentrations and/or different semiconductor compositions (heterojunctions).

In an embodiment, one or more LBARs 100, strained or barrier layers, or both, may be incorporated into an (Al)GaInAs emitter 42, or (Al)GaInP window 41 adjacent to the (Al)GaInAs emitter 42, within greater than 0 up to 1 micron from the interface between the (Al)GaInAs emitter 42 and the (Al)GaInP window 41, where parentheses enclosing a chemical element indicate that element is optional in the composition. In another embodiment, one or more LBARs 100, strained or barrier layers, or both, may be incorporated into an (Al)GaInAs base 44, or (Al)GaInAs or (Al)GaInP BSF layer 45 adjacent to the (Al)GaInAs base 44, within greater than 0 up to 1 micron from the interface between the (Al)GaInAs base 44 and the (Al)GaInAs or (Al)GaInP BSF layer 45. In an embodiment, one or more LBARs 100, strained or barrier layers, or both, may be incorporated into an (Al)GaInP emitter 22, or Al(Ga)InP window 21 adjacent to the (Al)GaInP emitter 22, within greater than 0 up to 1 micron from the interface between the (Al)GaInP emitter 22 and the Al(Ga)InP window 21. In another embodiment, one or more LBARs 100, strained or barrier layers, or both, may be incorporated into an (Al)GaInP base 24, or AlGa(In)As or Al(Ga)InP BSF layer 25 adjacent to the (Al)GaInP base 24, within greater than 0 up to 1 micron from the interface between the (Al)GaInP base 24 and the AlGa(In)As or Al(Ga)InP BSF layer 25. In another embodiment, the solar cell containing an emitter, base, window, BSF layer, LBARs, and/or strained or barrier layers may be a lattice-matched solar cell having a lattice-constant that is the same or nearly the same as that of the growth substrate. In another embodiment, the solar cell containing an emitter, base, window, BSF layer, LBARs, and/or strained or barrier layers may be a metamorphic solar cell having a lattice-constant that is substantially different than that of the growth substrate, where substantially different indicates a lattice mismatch greater than about 0.05%, and typically in a range from about 0.1% to about 4.0%. In another embodiment, the solar cell containing an emitter, base, window, BSF layer, LBARs, and/or strained or barrier layers may be a subcell in a multijunction solar cell.

In another embodiment, LBARs 100 may be incorporated into one or more third locations C corresponding to the quasi-neutral region of a base and/or emitter. The quasi-neutral region of a base or emitter exists outside of the space-charge region of that base or emitter. In this exemplary embodiment, an LBAR 100 is incorporated into a location C corresponding to the quasi-neutral region of the GaInP base 24. In another embodiment, LBARs 100 may be incorporated into one or more quasi-neutral regions of one or more of the bases 24, 44, 64 and/or emitters 22, 42, 62 of cell 10. In another embodiment, LBARs 100 are disposed in one or more quasi-neutral regions of a solar cell, which may be adjacent to a collecting p-n junction, or which may be some distance away from the collecting p-n junction such that charge carriers which escape from the LBARs 100 can migrate to the collecting p-n junction by carrier diffusion, rather than by field-aided drift.

Incorporating LBARs 100 into the cell 10 makes it possible to form tensile and compressive regions with respect to the normal cell composition and lattice constant within the same semiconductor material, without adding additional elements. The ability to form these regions of alternating smaller and larger lattice constant without adding additional elements avoids the difficulties in composition control and potentially deleterious effects on carrier lifetime that incorporation additional elements into the crystal lattice can cause, while still allowing a strain-balanced structure of multiple pseudomorphic tensile barriers/compressive wells to be formed, thereby increasing the optical thickness and current generating ability of the LBARs 100 without introducing any further imperfections or dislocations in the crystal lattice of the cell 10.

In an embodiment, the LBAR layers may have differing thicknesses from one another. In another embodiment, the strained or barrier layers may have differing thickness form one another. For example, an array of (n−1) LBARs of thickness x may be interleaved with n strained or barrier layers for strain balance of thickness y, where n is an integer, and additional LBARs of thickness x/2 may be placed at each end of the array of LBARs and strained or barrier layers, to complete the strain balance of the overall array. In another example, an array of n LBARs of thickness x may be interleaved with (n−1) strained or barrier layers for strain balance of thickness y, where n is an integer, and additional strained or barrier layers of thickness y/2 may be placed at each end of the array of LBARs and strained or barrier layers, to complete the strain balance of the overall array.

In another embodiment, there may be differing numbers of LBAR layers and strained or barrier layers. For example, an array of n LBARs of thickness x may be interleaved with (n−1) strained or barrier layers for strain balance of thickness y, where n is an integer, where the LBAR and strained or barrier layer thicknesses and compositions are tuned in order to strain balance the overall array, such that the LBARs are on the outside of the array, which may help with carrier escape in some instances, and/or may help to improve semiconductor interface quality for some layer compositions. In another example, an array of n LBARs of thickness x may be interleaved with (n+1) strained or barrier layers for strain balance of thickness y, where n is an integer, where the LBAR and strained or barrier layer thicknesses and compositions are tuned in order to strain balance the overall array, such that the strained or barrier layers are on the outside of the array, which may help to suppress minority-carrier concentration and recombination at interfaces in some instances, may help to confine charge carriers, may help to confine, increase, decrease dopant species concentration, may help to suppress diffusion of dopant atoms, and/or may help to improve semiconductor interface quality for some layer compositions.

In another embodiment, the LBARs 100 may have size scales small enough that the confined carriers show a change in energy level due to quantum mechanical effects (quantum confinement), or may have size scales large enough that the confined carriers have a small or negligible change in energy level. For example, quantum wells, quantum wires, or quantum dots may be used, or in the other extreme, large regions or the entirety of the space charge region, base quasi-neutral region, and/or emitter quasi-neutral region, and combinations thereof, may be of a lower bandgap than the rest of the solar cell.

Figure 2:
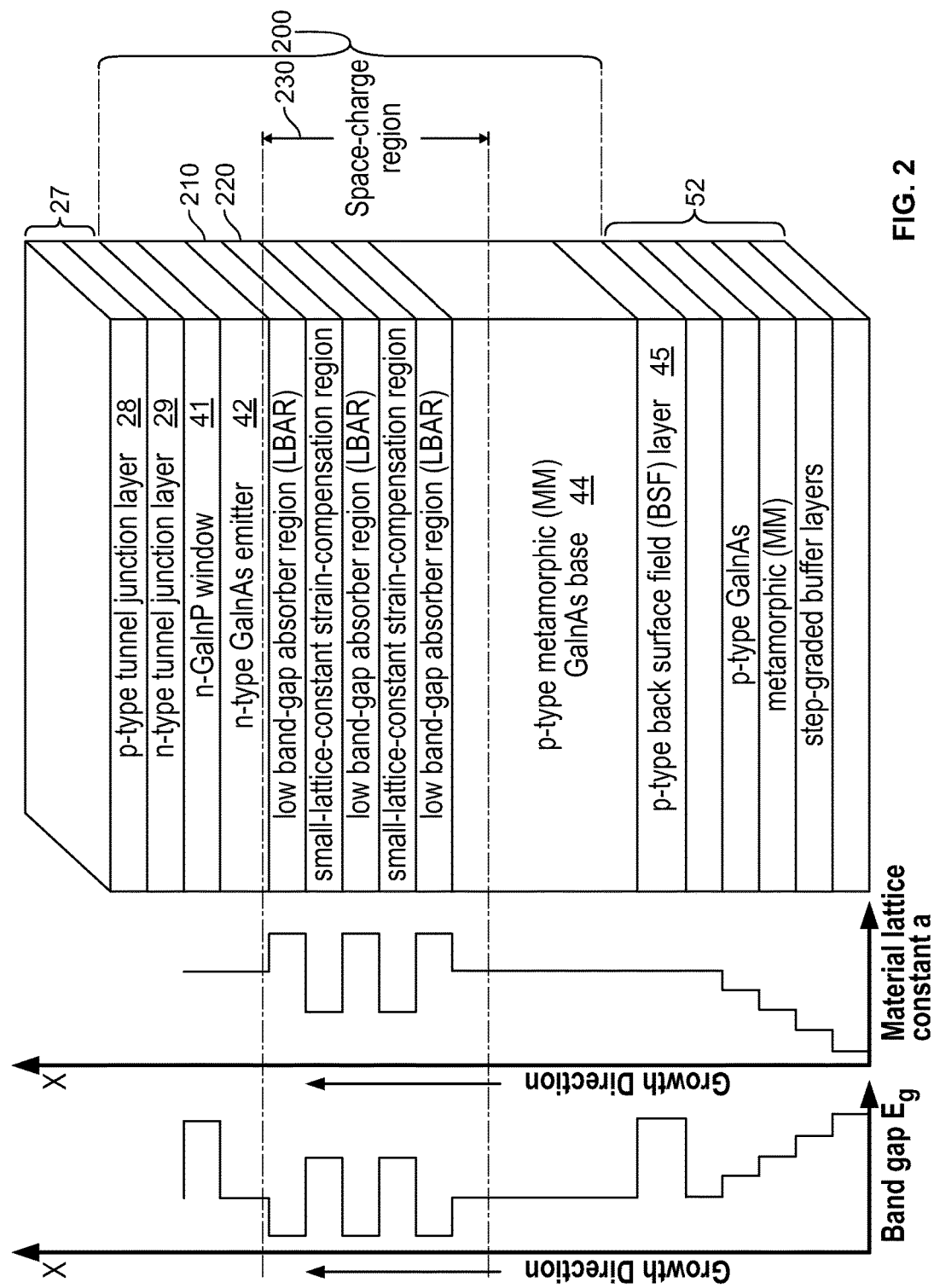
FIG. 2 illustrates an embodiment of a subcell according to the disclosure.

FIG. 2 illustrates another embodiment of a metamorphic subcell 200, tunnel junction 27, and metamorphic buffer 52 according to the disclosure. The subcell 200 has been gown in a direction away from a substrate (not shown). As can be seen in FIG. 2, the basic structure of the subcell 200 is the same as the middle cell 40 of FIG. 1, with like parts numbered and labeled the same. In an embodiment, the subcell 200 may be the middle cell of a 3-junction solar cell. As can be seen in FIG. 2, LBARs 210 and small-lattice-constant strain-compensation regions (SCRs) 220, also referred to as strain-balance layers or barrier layers in this specification, have been incorporated into the space-charge region 230 of the base 44, which corresponds to a position A (FIG. 1). In this exemplary embodiment, the LBARs 210 have a 2-D geometry, which in this embodiment, is a sheet or layer geometry. The LBARs 210 are formed of a material having a lower bandgap than the base 44. In an embodiment, the LBARs may be formed of GaInAs having a greater In concentration than the base 44, thereby resulting in a lower bandgap and a higher lattice constant than the base 44. To compensate for the higher lattice constant of the LBARs 210, SCRs 220 have been positioned between the LBARs 210, and between the LBARs 210 and the base 44 and emitter 42. The SCRs 220 are formed of a material having a smaller lattice constant than the LBARs 210. In an embodiment, the SCRs 220 may be GaInAs having a lower In concentration than the LBARs 210. In another embodiment, the s 220 may be formed of GaInPAs, GaNAs, GaIn NAS, or other semiconductor material having a lattice constant less than that of LBARs 210.

FIG. 2 further shows the general relationship between lattice constant and bandgap, respectively, of the subcell 200. The bandgap typically becomes lower as the layer composition is changed and the lattice constant is increased in the metamorphic graded buffer 52 in FIG. 2, to allow growth of subcells in a multijunction solar cell at a new lattice constant. At this new lattice constant, the back surface field (BSF) layer 45 and the window layer 41 have a higher lattice constant than the metamorphic solar cell base 44. The LBARs 210 may have lower bandgap than the base 44, and the strained or barrier layers may have higher bandgap than the base 44, as shown in FIG. 2. The smaller bandgap of the LBARs 210 results in increased photogeneration of electron-hole pairs and greater photogenerated current density at long wavelengths in the incident light spectrum than would be achieved by the metamorphic solar cell base, emitter, and other absorbing layers alone. The strain in the low bandgap LBARs 210 can be balanced by strain in the opposite direction by the small-lattice-constant strain-compensation regions (SCRs) 220, also called strain-balance or barrier layers. The SCRs 220 may have a higher bandgap than the base 44, suppressing minority-carrier concentration and undesirable minority-carrier recombination in those layers.

Typically, the semiconductor compositions that result in the lower bandgap of the LBARs 210 also result in the LBARs 210 having a larger material lattice constant than the base 44, where the material lattice constant is defined as the lattice constant a crystalline material would have if unstrained. In a solar cell, the LBARs 210 may be pseudomorphically-strained such that their in-plane lattice constant is the same as the layers above and below each LBAR 210, and is roughly the same as the lattice constant of the metamorphic base 44. Due to the larger material lattice constant of the LBARs 210 than that of the base 44, the LBARs 210 in FIG. 2 will be in compressive strain, and though their in-plane lattice constant (in a plane parallel to the semiconductor surface and to the growth plane) is approximately the same as that of the base 44 due to this strain, the lattice constant in a plane parallel to the semiconductor surface and to the growth plane is larger than that of the base 44.

The strain of the LBARs 210 may be balanced by strain in the opposite direction in the SCRs 220, also called strain-balance or barrier layers, which may be interleaved between the LBARs 210. Typically, the semiconductor compositions that result in the smaller material lattice constant of the strain-balance or barrier layers also result in the strain-balance or barrier layers having a larger bandgap than the base 44 and the LBARs 210, where, as before, the material lattice constant is defined as the lattice constant a crystalline material would have if unstrained. In a solar cell, the strain-balance or barrier layers may be pseudomorphically-strained such that their in-plane lattice constant is the same as the layers above and below each strain-balance or barrier layer, and is roughly the same as the lattice constant of the metamorphic base 44. Due to the smaller material lattice constant of the strain-balance or barrier layers than that of the base 44, the strain-balance or barrier layers in FIG. 2 will be in tensile strain, and though their in-plane lattice constant (in a plane parallel to the semiconductor surface and to the growth plane) is approximately the same as that of the base 44 due to this strain, the lattice constant in a plane parallel to the semiconductor surface and to the growth plane is smaller than that of the base 44.

FIG. 2 shows the case in which the array of LBARs 210 and/or SCRs 220 are positioned within the space-charge region of a p-n junction of a solar cell. In this configuration, the electric field in the space-charge region helps to transport electrons and holes that were photogenerated in the LBARs 210 to their collecting terminals on either side of the p-n junction.

Figure 3:
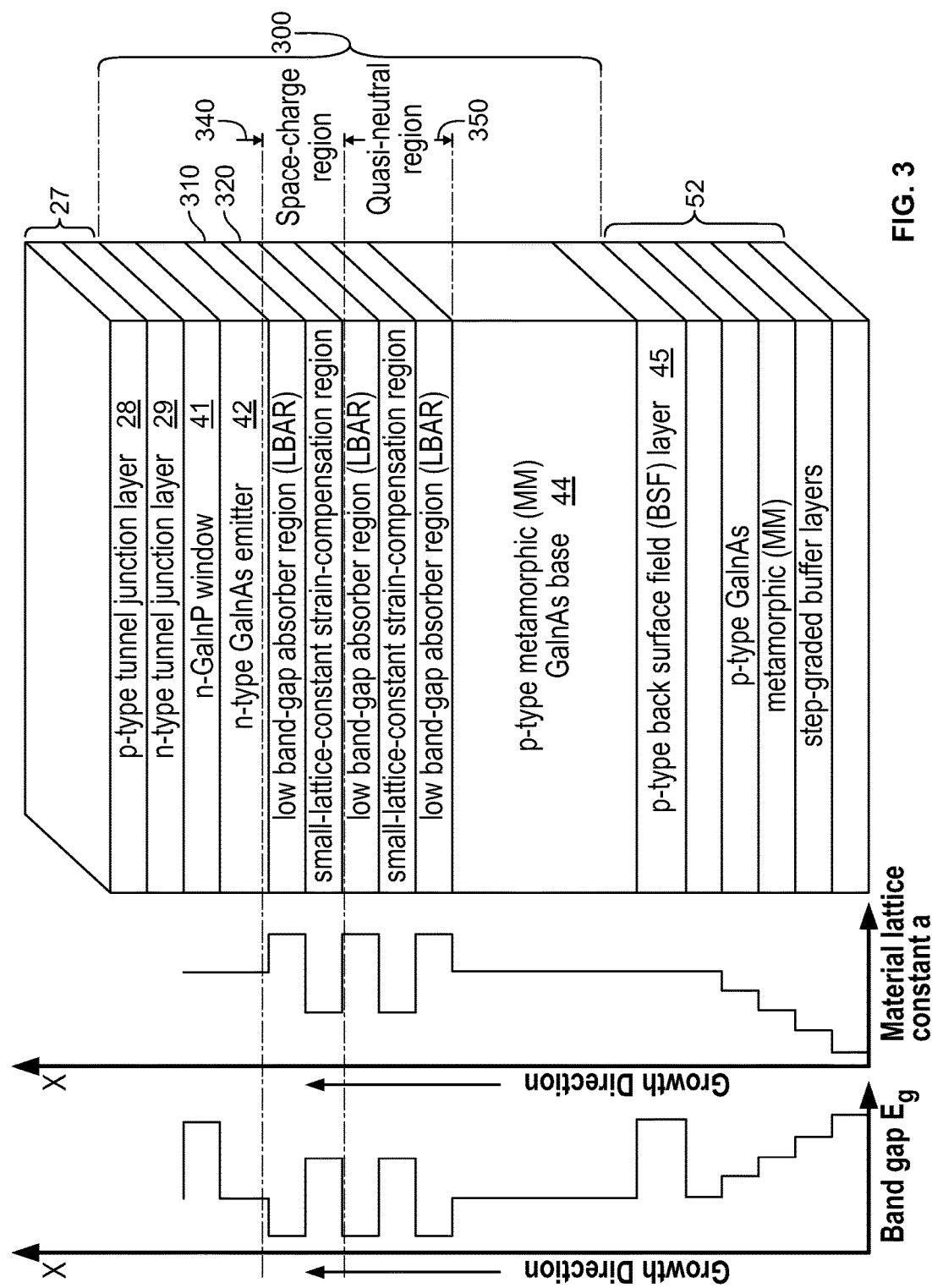
FIG. 3 illustrates another embodiment of a subcell according to an embodiment of the disclosure.

FIG. 3 illustrates another embodiment of a metamorphic subcell 300, tunnel junction 27, and metamorphic buffer 52 according to the disclosure. The subcell 300 has been grown in a direction away from a substrate (not shown). As can be seen in FIG. 3, the basic structure of the subcell 300 is the same as the middle cell 40 of FIG. 1, with like parts numbered and labeled the same. In an embodiment, the subcell 300 may be the middle cell of a 3-junction solar cell. As can be seen in FIG. 3, LBARs 310 and small-lattice-constant strain-compensation regions (SCRs) 320 have been incorporated into the space charge region 330 and quasi-neutral region of the base 44, which corresponds to a position A and C (FIG. 1). The LBARs 310 and SCRs 320 have the same characteristics as discussed above in reference to FIG. 2.

FIG. 3 shows the case in which the array of LBARs 310 and SCRs 320 is positioned partly within the space-charge region of a p-n junction of a solar cell, and partly in one of the quasi-neutral regions on each side of the p-n junction, for example, FIG. 3 shows the LBARs 310 array partly in the quasi-neutral region of the p-type base. Although there is no strong electric field to assist with carrier collection by drift in the quasi-neutral region, carriers photogenerated in the LBARs 310 can still leave the LBARs 310 by thermal escape, and can still be transported to the collecting p-n junction by diffusion. This allows a greater cumulative thickness of LBARs 310 to be employed for greater photoabsorption and cell current than could fit in the space-charge region alone. Although the current collection efficiency from LBARs 310 in the quasi-neutral region can be lower than in the space-charge region, they can still generate substantial and useful enhancements to the current density.

Figure 4:
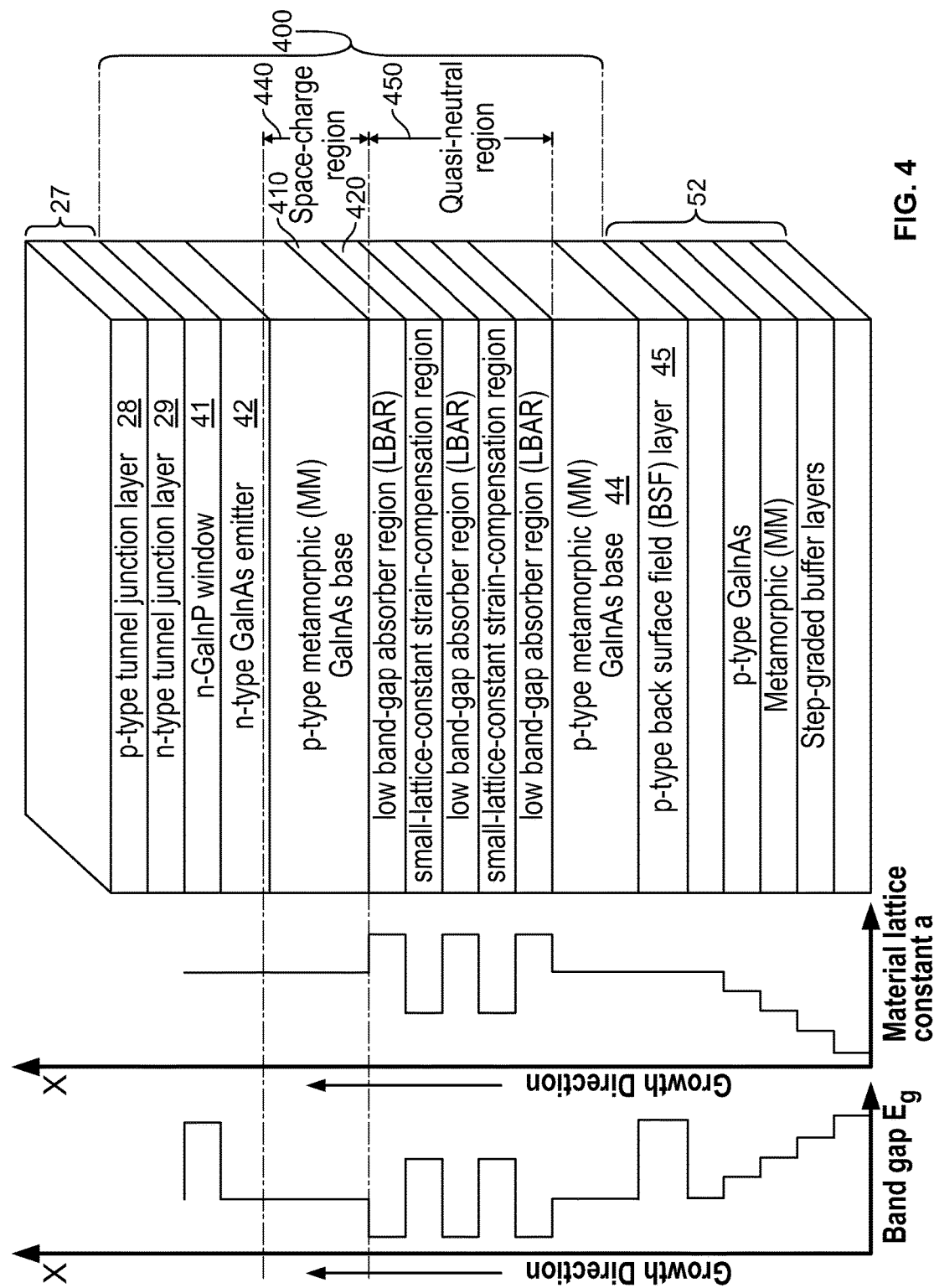
FIG. 4 illustrates another embodiment of a subcell according to an embodiment of the disclosure.

FIG. 4 illustrates another embodiment of a metamorphic subcell 400, tunnel junction 27, and metamorphic buffer 52 according to the disclosure. The subcell 400 has been grown in a direction away from a substrate. As can be seen in FIG. 4, the basic structure of the subcell 400 is the same as the middle cell 40 of FIG. 1, with like parts numbered and labeled the same. In an embodiment, the subcell 400 may be the middle cell 40 of 3-junction solar cell. As can be seen in FIG. 4, LBARs 410 and SCRs 420 have been incorporated into the quasi-neutral region of the base 44, which corresponds to position C (FIG. 1). The LBARs 410 and SCRs 420 have not been incorporated into space-charge region 440. The LBARs 410 and SCRs 420 have the same characteristics as discussed above in reference to FIG. 2.

FIG. 4 shows the case in which the array of LBARs 410 and SCRs 420 are positioned within one of the quasi-neutral regions on each side of the p-n junction, for example, FIG. 4 shows the LBARs 410 array fully within the quasi-neutral region of the p-type base. As discussed before, although there is no strong electric field to assist with carrier collection by drift in the quasi-neutral region, carriers photogenerated in the LBARs 410 can still leave the LBARs 410 by thermal escape, and can still be transported to the collecting p-n junction by diffusion. This allows a greater cumulative thickness of LBARs 410 to be employed for greater photoabsorption and cell current than could fit in the space-charge region alone. Although the current collection efficiency from LBARs 410 in the quasi-neutral region can be lower than in the space-charge region, they can still generate substantial and useful enhancements to the current density.

In an embodiment, the LBARs 410 may be composed of GaInAs with an indium composition larger than that of a GaInAs solar cell base, with SCRs 420 composed of GaInAs with an indium composition smaller than that of the GaInAs solar cell base to provide strain compensation. In an embodiment, the LBARs 410 may be composed of GaInAs with an indium composition larger than that of a GaInAs solar cell base, with SCRs 420 composed of GaAs with smaller material lattice constant than that of the GaInAs solar cell base to provide strain compensation. In an embodiment, the LBARs 410 may be composed of GaInAs with an indium composition larger than that of a GaInAs solar cell base, with SCRs 420 composed of GaPAs with smaller material lattice constant than that of the GaInAs solar cell base to provide strain compensation. In an embodiment, the LBARs 410 may be composed of GaInP with an indium composition larger than that of a GaInP solar cell base, with SCRs 420 composed of GaInP with In composition smaller than that of the GaInP solar cell base to provide strain compensation. Many other materials and combinations of materials can be employed in the LBARs 410, the SCRs 420, and the other solar cell structures such as the base and the emitter, as described in part below.

In an embodiment, the overall array of LBARs and SCRs described in this patent specification may be positioned in the space-charge region near the p-n junction of a solar cell, as in FIG. 2. In an embodiment, the overall array of LBARs and SCRs described in this patent specification may be positioned partly in the space-charge region near the p-n junction of a solar cell, and partly in the quasi-neutral region of a solar cell, as in FIG. 3. In an embodiment, the overall array of LBARs and SCRs described in this patent specification may be positioned in the quasi-neutral region of a solar cell, as in FIG. 4.

Figure 5:
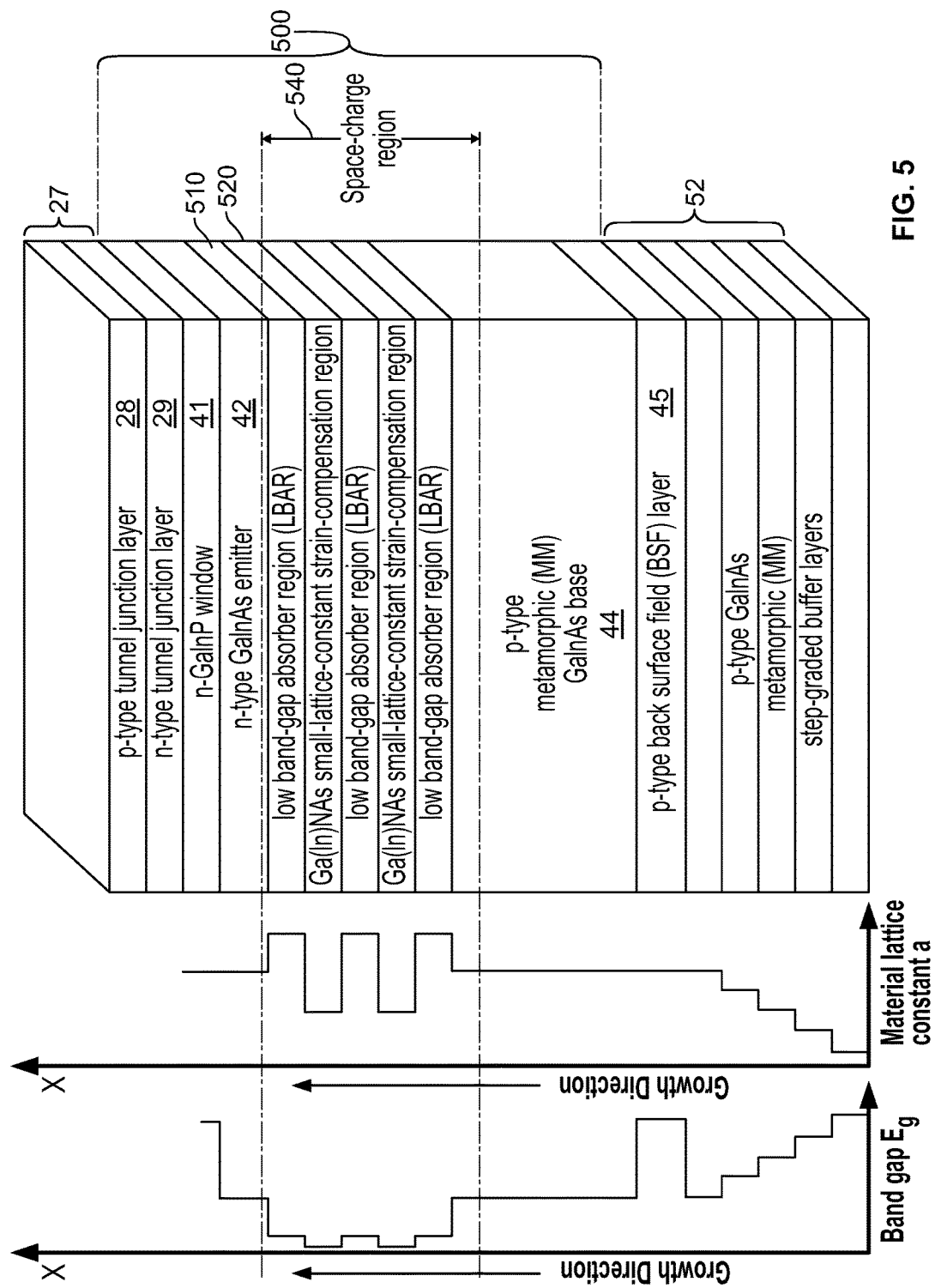
FIG. 5 illustrates another embodiment of a subcell according to an embodiment of the disclosure.

FIG. 5 illustrates another embodiment of a metamorphic subcell 500, tunnel junction 27, and metamorphic buffer 52 according to the disclosure. The subcell 500 has been grown in a direction away from a substrate. As can be seen in FIG. 5, the basic structure of the subcell 500 is the same as the middle cell 40 of FIG. 1, with like parts numbered and labeled the same. In an embodiment, the subcell 500 may be the middle cell 40 of 3-junction solar cell. As can be seen in FIG. 5, LBARs 510 and small-lattice-constant strain-compensation regions (SCRs) 520 have been incorporated into the space charge region 540 of the base 44, which corresponds to position A (FIG. 1). This arrangement is similar to that shown in FIG. 2, however, in this embodiment, the LBARS 510 and SCRs 520 both have lower bandgaps than the material of the base 44 The LBARs 510 and SCRs 520 have the same characteristics as discussed above in reference to FIG. 2.

Often, LBARs with lower bandgap than the solar cell base have a composition which also causes them to have a larger material lattice constant than, and to be in compressive strain with respect to the solar cell base. Similarly, SCRs with a material lattice constant and tensile strain with respect to the solar cell base and to the LBARs, designed to strain-balance the compressive LBARs, have a composition which also causes them to have higher bandgap than the solar cell base and than the LBARs. But this need not always be the case. In an embodiment, LBARs with a low bandgap for enhanced photoabsorption and photocurrent generation and relatively large material lattice constant may be strain-compensated with SCRs with relatively small material lattice constant which also have low bandgap for enhanced photoabsorption and photocurrent generation. In an embodiment, both LBARs and SCRs are incorporated into a solar cell base, and both LBARs and SCRs have bandgaps that are lower than that of the solar cell base. In an embodiment, the LBARs have larger material lattice constant than the SCRs, and are in compressive strain with respect to the SCRs within the array of LBARs and SCRs, while the SCRs have smaller material lattice constant than the LBARs, and are in tensile strain with respect to the LBARs within the array of LBARs and SCRs. In an embodiment, an extended low bandgap absorber region may be formed from alternating compressive and tensile LBAR and SCR layers, all of which have low bandgap for enhanced photoabsorption and photocurrent generation, where the extended low bandgap absorber region has a thickness larger, and potentially much larger than the thickness at which either the strained LBAR material or the strained SCR material could remain pseudomorphic, with a coherent, high-quality, low-dislocation, single crystalline structure. In an embodiment this extended low bandgap absorber region comprising alternating compressive and tensile low bandgap layers forms part of the solar cell base, for instance the part of the base within the space-charge region near the p-n junction. In an embodiment this extended low bandgap absorber region comprising alternating compressive and tensile low bandgap layers forms all of the solar cell base. In other embodiments, the LBAR and/or SCR layers described above as being incorporated into a solar cell base, may also be incorporated into the emitter, back-surface field (BSF) layer, window, or any other layer in the structure of a solar cell, or any combination of the above layers of a solar cell structure. In other embodiments, the LBAR and/or SCR layers with bandgaps higher, lower, or the same as a solar cell base, may also be designed with bandgaps higher, lower, or the same as the emitter, BSF layer, window, or any other layer in the structure of a solar cell, or any combination of the above layers of a solar cell structure.

When layers with smaller lattice constant than that of the solar cell base are used to counteract the compressive strain of 2D (sheets), 1D (wires), or 0D (dots) LBARs with larger lattice constant than that of the solar cell base, those small-lattice-constant strain-compensation layers tend to have higher bandgap than that of the LBARs or the solar cell base, since within the same or similar semiconductor material system there is a tendency for bandgap to rise as one alters the composition to lower the lattice constant. This higher bandgap of the strain-compensation layers between the LBARs may be detrimental to solar cell performance, since 1) these higher bandgap regions limit the number of LBARs and their cumulative thickness available for light absorption that can be placed in a given thickness of the solar cell, e.g., in the space-charge region; and 2) higher bandgap layers are barriers for carrier transport that can block the flow of useful current photogenerated in the LBAR to the collecting p-n junction and to the solar cell terminals.

However, some semiconductors exhibit a decrease in bandgap as the lattice constant is decreased, e.g., diluted nitride GaNAs, GaInNAs, and GaInNAsSb semiconductor compositions with 0 to 5 atomic percent nitrogen, and more preferably 0.5-3.0% nitrogen. This allows the LBAR/strain-compensation layer structure to be engineered such that both the LBARs and the SCRs have a lower bandgap than the solar cell base, thus maximizing the thickness available for light absorption and increased current photogeneration, and removing high bandgap barriers to current flow. The bandgap in the LBARs and SCRs may be made approximately equal to each other if desired.

In an embodiment, a solar cell may incorporate LBARs composed of GaInAs with low bandgap for enhanced photocurrent generation and compressive strain, and may incorporate SCRs composed of GaNAs with also have low bandgap for enhanced photocurrent generation, but which have smaller material lattice constant than that of the GaInAs LBARs, and which have tensile strain in order to compensate the strain of the LBARs, thus forming a pseudomorphic, extended low bandgap absorber region which is much thicker than the maximum thickness at which either the strained LBAR material or the strained SCR material can remain pseudomorphic, as shown in FIG. 5.

A thick low bandgap layer may also be produced by allowing the elements of the LBAR and the SCRs to form a homogeneous LBAR with the same lattice constant as the solar cell base, for instance, an LBAR formed from GaInNAs with a lower bandgap, but the same lattice constant as a GaInAs solar cell base. It may be desirable in some cases to separate certain elements from others, to avoid undesirable interactions in the crystal lattice that cause increased recombination, e.g. the formation of In—N pairs in GaInNAs, or to avoid gas phase reactions during growth, by introducing reactive precursor gases into the reaction changer at different times. This can be accomplished by using the LBAR/SCR structure described above, e.g., with high-In GaInAs LBARs combined with GaNAs SCRs, achieving a low bandgap region, but with lower recombination rate due to the separation of In and N in their respective layers.

LBARs may have a wide range of spatial extents: they may be quite wide with widths from 0.1 micron to about 1 micron or more; they may be in a middle range with widths from approximately 100 A to about 1000 A, or they may be quite narrow in a range from greater than 0 to about 100 A in which there is a strong effect of quantum confinement on the energy levels of carriers within the LBARs. The width of the LBARs and the SCRs is primarily determined by the constraints of how lattice-mismatched the layers are from each other and the solar cell base, and how thick each layer can become while remaining pseudomorphic, i.e., before the crystal lattice relaxes and develops dislocations.

In the case of GaInAs LBARs and GaNAs SCRs, the LBARs may be relatively thick, or they may be extremely thin with thickness on the order of one to several lattice constants, to form a metamaterial of GaInAs and GaNAs layers with a properties different from a homogeneous alloy of GaInNAs. These same concepts can be extended to other semiconductor material systems as well.

In another embodiment the tensile-strained layer or layers and the compressive strained layer or layers incorporated into the solar cell structure, may both have bandgaps higher than that of the solar cell base, emitter, BSF layer, window, or other solar cell structure or combination of structures. In some instances and in some solar cell structures, the reduced minority-carrier recombination that can result from the higher bandgap of these layers or layers may be more desirable than the increased photogenerated current that can result from a lower bandgap layer. In another embodiment the tensile-strained layer or layers and the compressive strained layer or layers incorporated into the solar cell structure, may both have bandgaps the same as that of the solar cell base, emitter, BSF layer, window, or other solar cell structure or combination of structures. In another embodiment the tensile-strained layer or layers may have a bandgap or bandgaps that is/are higher than that of the solar cell base, emitter, BSF layer, window, or other solar cell structure or combination of structures, while the compressive strained layer or layers incorporated into the solar cell structure may have a bandgap or bandgaps that is/are lower than that of the solar cell base, emitter, BSF layer, window, or other solar cell structure or combination of structures. In another embodiment the tensile-strained layer or layers may have a bandgap or bandgaps that is/are lower than that of the solar cell base, emitter, BSF layer, window, or other solar cell structure or combination of structures, while the compressive strained layer or layers incorporated into the solar cell structure may have a bandgap or bandgaps that is/are higher than that of the solar cell base, emitter, BSF layer, window, or other solar cell structure or combination of structures.

In another embodiment the tensile-strained layer or layers and/or the compressive strained layer or layers may fully replace the solar cell base, emitter, BSF layer, window, or other solar cell structure or combination of structures. In another embodiment the tensile-strained layer or layers and/or the compressive strained layer or layers may replace part of, or be incorporated into, the solar cell base, emitter, BSF layer, window, or other solar cell structure or combination of structures.

Low bandgap absorber regions, or LBARs, can also be formed from materials that are unstrained or have little strain with respect to the solar cell semiconductor structure in which they are incorporated, e.g., the solar cell base. In this case, SCRs are not needed to balance the strain of the LBARs, since they have no strain or little strain. For this situation, very wide LBARs can be formed, since there is no longer any maximum thickness constraint for the material to remain pseudomorphic in the unstrained case, or this thickness is very large in the case with very small strain. This enhances the ability of the LBAR to absorb light and generate current since the thickness is not limited by strain concerns. Even within finite thicknesses imposed by other features in the cell, such as the width of the space charge region width in the case for which it is desired to have the LBAR within the space charge region, this allows greater photoabsorption and photocurrent enhancement, since all of this thickness can be taken up with the LBAR, with none of it consumed with high bandgap SCRs.

In an embodiment, a solar cell may incorporate an LBAR or LBARs which have the same material lattice constant as the solar cell structures in which they are incorporated, and thus have no strain or little strain, and thus require no SCRs. In an embodiment, the LBAR or LBARs have the same composition and same material lattice constant as the solar cell base, but are lower in bandgap due to a greater amount of atomic ordering of two or more elements in the semiconductor crystal structure. In an embodiment, the LBAR or LBARs have the same composition and same material lattice constant as the solar cell base, but are lower in bandgap due to a greater amount of atomic ordering on the group-III sublattice of the III-V semiconductor crystalline structure in the LBAR or LBARs. In an embodiment, the LBAR or LBARs have the same composition and same material lattice constant as the solar cell base, but are lower in bandgap due to a greater amount of atomic ordering on the group-V sublattice of the III-V semiconductor crystalline structure in the LBAR or LBARs.

In an embodiment, the LBAR or LBARs are composed of GaInP with the same composition and same material lattice constant as a GaInP solar cell base, but with lower bandgap in the LBAR or LBARs due to an ordered or partially ordered arrangement of Ga and In atoms on the group-III sublattice, thus lowering their bandgap with respect to the disordered or partially disordered GaInP base. Since the GaInP LBARs are of the same or similar composition as the GaInP base, SCRs are not needed for strain balancing.

In an embodiment, a solar cell may incorporate an LBAR or LBARs which have the same or a similar lattice constant to the solar cell structure into which they are incorporated, such as a solar cell base, but have lower bandgap due to a different semiconductor composition in the LBAR (or LBARs) and the solar cell base. Again, since the lattice constant is the same or similar in the LBAR (or LBARs) and in the solar cell base, no SCRs are needed for strain compensation.

In an embodiment, LBARs with GaInP or lower-Al AlGaInP composition may be incorporated into a solar cell base with higher-Al AlGaInP composition, with the same or similar material lattice constant in the LBAR or LBARs as in the solar cell base. In an embodiment, LBARs with GaAs or lower-Al AlGaAs composition may be incorporated into a solar cell base with higher-Al AlGaAs composition, with the same or similar material lattice constant in the LBAR or LBARs as in the solar cell base. In an embodiment, LBARs with GaAs, GaInAs, or lower-Al AlGaInAs composition may be incorporated into a solar cell base with higher-Al AlGaInAs composition, with the same or similar material lattice constant in the LBAR or LBARs as in the solar cell base. In an embodiment, LBARs with GaInAs or GaInPAs composition may be incorporated into a solar cell base with GaInPAs or GaInP composition, with the same or similar material lattice constant in the LBAR or LBARs as in the solar cell base. In an embodiment, LBARs with GaN or lower-Al AlGaN composition may be incorporated into a photovoltaic cell base with higher-Al AlGaN composition, with the same or similar material lattice constant in the LBAR or LBARs as in the photovoltaic cell base. In an embodiment, LBARs with GaSb or lower-Al AlGaSb composition may be incorporated into a solar cell base with higher-Al AlGaSb composition, with the same or similar material lattice constant in the LBAR or LBARs as in the solar cell base. In an embodiment, LBARs with GaInAs or GaInAsSb composition may be incorporated into a solar cell base with GaInAsSb or GaAsSb composition, with the same or similar material lattice constant in the LBAR or LBARs as in the solar cell base. In an embodiment, LBARs with InAsSb or GaInAsSb composition may be incorporated into a solar cell base with GaInAsSb or GaInSb composition, with the same or similar material lattice constant in the LBAR or LBARs as in the solar cell base.

In an embodiment, a solar cell or photovoltaic cell may incorporate LBARs composed of GaInAs, GaInP, AlGaInAs, AlGaInP, GaPAs, InPAs, GaInPAs, GaAsSb, AlInSb, GaInSb, InAsSb, AlInAs, AlInP, GaInN, GaNAs, GaInNAs, SiGe, or SiGeSn with composition such that the bandgap in the LBARs is less than that of the solar cell base. In an embodiment, said LBARs have a material lattice constant which is different from that of the solar cell base. In another embodiment, said LBARs have a material lattice constant which is the same or similar to that of the solar cell base. In an embodiment, a solar cell or photovoltaic cell may incorporate small-lattice-constant strain-compensation regions (SCRs) composed of GaInAs, GaInP, AlGaInAs, AlGaInP, GaPAs, InPAs, GaInPAs, GaAsSb, AlInSb, GaInSb, InAsSb, AlInAs, AlInP, GaInN, GaNAs, GaInNAs, SiGe, or SiGeSn, such that the material lattice constant and thickness of the SCRs strain balances the strain in the LBAR layers, so that all layers may remain pseudomorphic with high crystal quality at the same in-plane lattice constant. In an embodiment, the solar cell incorporates only LBARs, without SCRs. In an embodiment, the solar cell incorporates only SCRs, without LBARs. In an embodiment, the solar cell incorporates both LBARs and SCRs.

In an embodiment, the LBARs and the solar cell base may be composed of the same elements, but with the composition of the LBARs giving a lower bandgap than the solar cell base. In an embodiment, the SCRs and the solar cell base may be composed of the same elements, but with the composition of the SCRs giving a material lattice constant which results in a strain-balanced or zero net strain array. In an embodiment, the LBARs and the SCRs may be composed of the same elements, but with the composition of the LBARs giving a lower bandgap than the solar cell base, and the composition of the SCRs giving a material lattice constant which results in a strain-balanced or zero net strain array when combined with the LBARs within the solar cell. In an embodiment, the LBARs, the SCRs, and the solar cell base may be composed of the same elements, but with the composition of the LBARs giving a lower bandgap than the solar cell base, and the composition of the SCRs giving a material lattice constant which results in a strain-balanced or zero net strain array when combined with the LBARs within the solar cell.

In an embodiment, the LBARs and the SCRs may be composed of different elements, with the composition of the LBARs giving a lower bandgap than the solar cell base, and the composition of the SCRs giving a material lattice constant which results in a strain-balanced or zero net strain array when combined with the LBARs within the solar cell. In an embodiment, the LBARs, the SCRs, and the solar cell or photovoltaic cell base may be composed of different elements, with the composition of the LBARs giving a lower bandgap than the solar cell base, and the composition of the SCRs giving a material lattice constant which results in a strain-balanced or zero net strain array when combined with the LBARs within the solar cell.

In an embodiment, the SCRs may be positioned between each pair of LBARs. In an embodiment, the LBARs may be positioned between each pair of SCRs.

In an embodiment the solar cells with LBARs and/or SCRs incorporated are subcells within a multijunction cell, for which the solar spectrum utilization is improved and the energy conversion efficiency is made more efficient through the change in spectral response resulting from incorporation of the LBARs and/or SCRs.

In an embodiment, one or more of the solar cells described above may be a metamorphic solar cell with lattice constant different from that of a growth substrate. In an embodiment, one or more of the solar cells described above may be a lattice-matched solar cell with lattice constant approximately the same as that of a growth substrate.

In an embodiment, one or more of the solar cells described above may be grown in an inverted configuration, where an inverted growth configuration is defined such that the layers of the solar cell designed to be toward the sun or other light source during solar cell operation (layers toward the sunward surface) are grown first, followed by the rest of the solar cell layers, finishing with the layers of the solar cell designed to be away from the sun or other light source during solar cell operation (layers away from the sunward surface). Such an inverted growth configuration is in contrast to an upright growth configuration, defined such that the layers of the solar cell designed to be away from the sun or other light source during solar cell operation (layers away from the sunward surface) are grown first, followed by the rest of the solar cell layers, finishing with the layers of the solar cell designed to be toward the sun or other light source during solar cell operation (layers toward the sunward surface).

In an embodiment, one or more of the solar cells described above may be an inverted metamorphic cell, with an inverted growth configuration as defined above, and with a base or primary absorber layer having a material lattice constant that is different from that of a growth substrate. In an embodiment, one or more of the solar cells described above may be an inverted lattice-matched cell, with an inverted growth configuration as defined above, and with a base or primary absorber layer having a material lattice constant that is approximately the same as that of a growth substrate.

In an embodiment, one or more of the solar cells described above may be incorporated in a stack of subcells forming a multijunction solar cell that is grown: on a single side of a growth substrate; on both sides of a growth substrate; in a single growth run; in two or more growth runs; in a single growth run on a single side of the growth substrate; in a single growth run on both sides of the growth substrate; in two or more growth runs on a single side of the growth substrate; or, in two or more growth runs on both sides of the growth substrate.

In an embodiment, one or more of the solar cells may be a subcell in a multijunction solar cell formed by wafer bonding or semiconductor bonding technology (SBT) in which subcells are integrated into a multijunction solar cell by direct bonding between two semiconductor layers to form a semiconductor/semiconductor bonded interface. In an embodiment, one or more of the solar cells may be a subcell in a multijunction solar cell formed by mechanical stacking in which subcells are integrated into a multijunction solar cell by joining them together with an adhesive, dielectric, metallic, conductive or non-conductive layer that is not a semiconductor, which may or may not be patterned, and which generally allows light of the desired wavelengths to pass through to the subcells beneath.

A subcell in the semiconductor-bonded or mechanically-stacked multijunction solar cell may have different material lattice constant than some subcells in the multijunction stack, where the subcells are integrated by lattice-mismatched growth, metamorphic growth with a graded buffer layer, semiconductor bonding, or mechanical stacking. Said subcell in the semiconductor-bonded or mechanically-stacked multijunction solar cell may also have approximately the same material lattice constant as other subcells in the multijunction stack, where the subcells are integrated by lattice-matched growth, semiconductor bonding, or mechanical stacking. Likewise, a subcell in the semiconductor-bonded or mechanically-stacked multijunction solar cell may have been grown on a different growth substrate than some subcells in the multijunction stack, where the subcells are integrated by semiconductor bonding or mechanical stacking. Said subcell in the semiconductor-bonded or mechanically-stacked multijunction solar cell may also have been grown on the same growth substrate as other subcells in the multijunction stack, where some subsets of subcells in the multijunction stack may be grown on the same growth substrate with an upright growth configuration, and inverted growth configuration, or both.

LBARs and SCRs may also be placed in a solar cell with an ordered GaInP (o-GaInP) base, a disordered GaInP (d-GaInP) base, or an ordered or disordered AlGaInP base. The terms ordered and disordered refer to the positions group-III atoms in the periodic table (Al, Ga, In, etc.) on the group-III sublattice. Whether the semiconductor is ordered or disordered in this sense, the crystal lattice can have, and ideally does have, a perfectly periodic crystal structure. At the same semiconductor composition, i.e., ratio of Ga to In, disordered GaInP has a bandgap that is on the order of 100 meV higher than GaInP with partial group-III ordering that is readily achievable in practice (referred to here as ordered GaInP, although the group-III ordering may not be complete, i.e., the ordering parameter may be less than unity), near the GaAs lattice constant. This effect of group-III sublattice disordering on bandgap has been confirmed in metamorphic GaInP solar cells with higher indium composition and lattice constant as well as for GaInP lattice matched to Ge or GaAs, and also occurs in AlGaInP. The bandgap change with disordering diminishes as the GaInP composition approaches that of InP, but for most metamorphic GaInP compositions of interest for solar cells, e.g. from about 0 to 20% In composition, the bandgap change with disordering is still quite significant.

Figure 6:
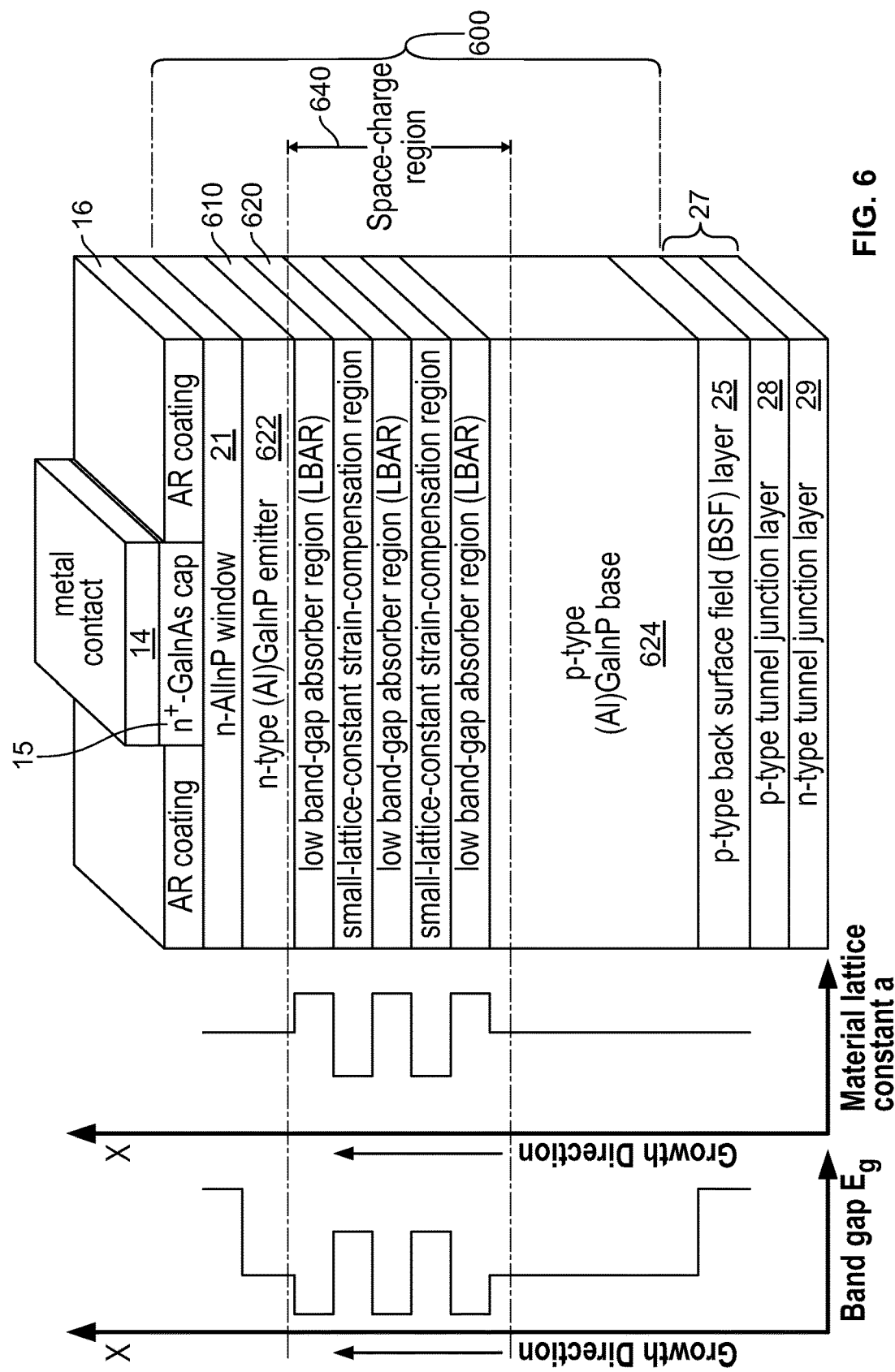
FIG. 6 illustrates another embodiment of a subcell according to an embodiment of the disclosure.

FIG. 6 illustrates another embodiment of a metamorphic subcell 600 according to the disclosure. In this exemplary embodiment, the subcell 600 is a top cell, having a similar configuration as top cell 20 in FIG. 1. As can be seen in FIG. 6, the subcell 600 has an antireflective coating 16 deposited a top the subcell 600 and a p-n junction 27 deposited below the subcell 600 The subcell 600 has been gown in a direction away from a substrate (not shown). In an embodiment, the subcell 600 may be the top cell 40 of 3-junction solar cell.

As can be seen in FIG. 6, the LBARs 610 and SCRs 620 are placed in the space-charge region 640 of subcell 600 having a (Al)GaInP base 624. The (Al)GaInP base 624 may be an ordered GaInP (o-GaInP) base, a disordered GaInP (d-GaInP) base, or an ordered or disordered AlGaInP base. In this case, high indium-composition layers may be used for the LBARs 610, and low-indium-composition layers may be used for the SLCLs 620, in a strain-balanced configuration. The relationships between bandgap and lattice constant of the tensile-strained layers, the compressive-strained layers, and other device layers are diagrammed in FIG. 6, for the particular example of subcell 600. In other embodiments, the bandgaps of the tensile-strained layers and compressive-strained layers may vary from those shown here, for example, by adding, subtracting, or varying the Al, Ga, In, N, P, As, or Sb composition of the layers, or by varying the degree of ordering of the group-III or group-V sublattices. In other embodiments, the tensile-strained layers and/or compressive-strained layers may be positioned in layers in addition to, or instead of the solar cell base, such as the emitter, back-surface field (BSF) layer, window, and/or tunnel junction layers of the device. In other embodiments, the tensile-strained layers may form part or all of some layers of the solar cell device, such as the solar cell base, emitter, BSF layer, window, or tunnel junction layers of the device, including combinations of those layers, for example, to compensate strain in other parts of the device, to decrease minority-carrier concentration and recombination in those layers, and/or to increase light transmission in those layers to layers beneath that are better able to use light at the transmitted wavelengths. In other embodiments, the compressive-strained layers may form part or all of some layers of the solar cell device, such as the solar cell base, emitter, BSF layer, window, or tunnel junction layers of the device, including combinations of those layers, for example, to compensate strain in other parts of the device, and/or to increase light absorption and photogenerated current in those layers, and to increase utilization of wavelengths that would otherwise not be able to be used by the solar cell, or would not be used as effectively.

Ordered GaInP may be used as the low bandgap material in a wide LBAR in a disordered GaInP or AlGaInP solar cell, due to its lower bandgap resulting from group-III sublattice ordering. Since the ordered GaInP can have the same lattice constant as the surrounding, higher bandgap disordered GaInP or AlGaInP material, there is no concern about the LBAR thickness exceeding the critical thickness for crystal lattice relaxation as there is in lattice-matched systems, and the ordered GaInP LBAR may be made as thick as desired in order to optimize other parameters in the solar cell, such as light absorption in the LBAR and overall recombination in the cell.

Figure 7:
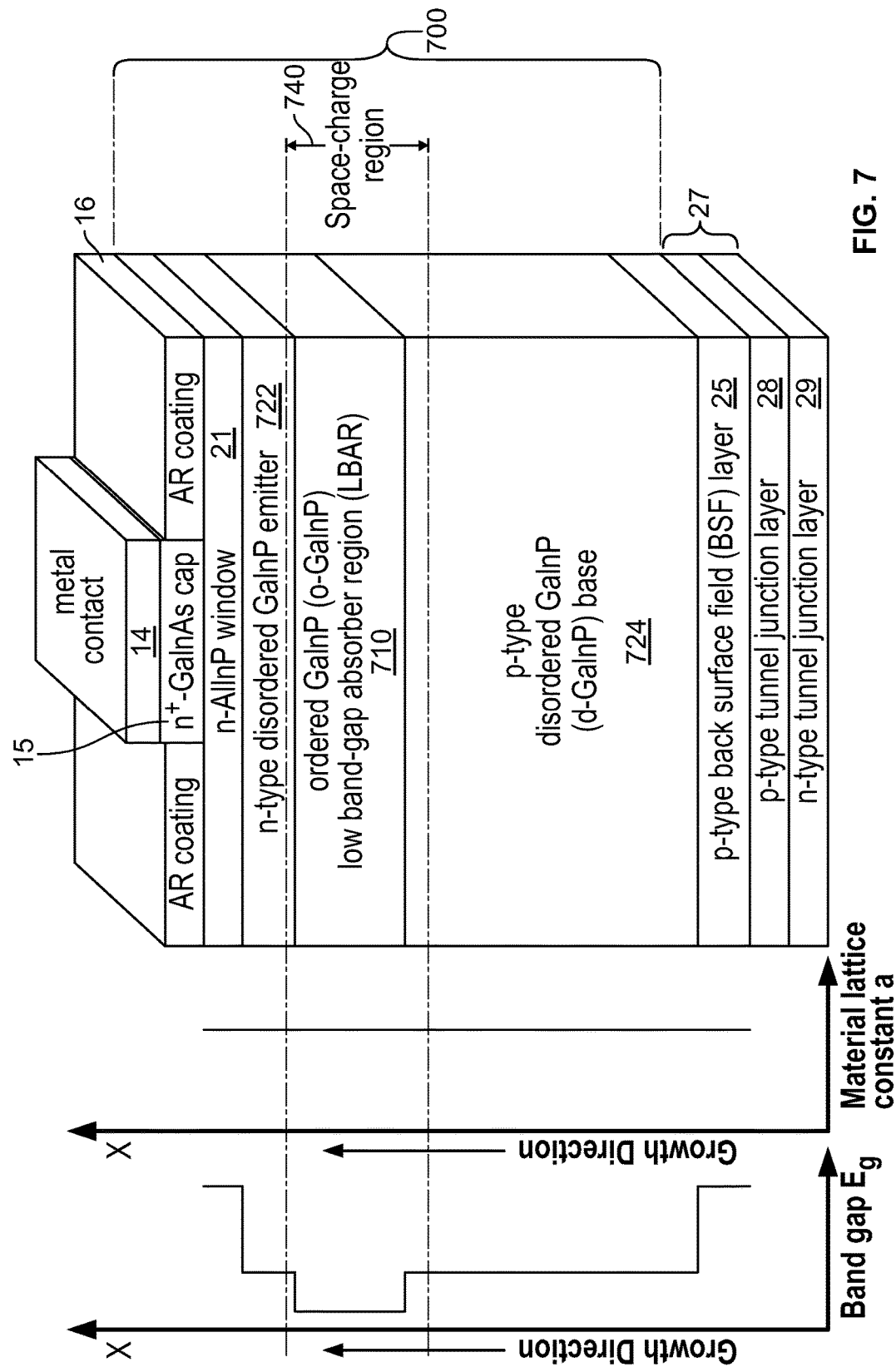
FIG. 7 illustrates another embodiment of a subcell according to an embodiment of the disclosure.

FIG. 7 illustrates another embodiment of a metamorphic subcell 700 according to the disclosure. In this exemplary embodiment, the subcell 700 is a top cell, having a similar configuration as top cell 20 in FIG. 1. As can be seen in FIG. 7, the subcell 700 has an antireflective coating 16 deposited a top the subcell 700 and a p-n junction 27 deposited below the subcell 700 The subcell 700 has been gown in a direction away from a substrate (not shown). In an embodiment, the subcell 700 may be the top cell 40 of 3-junction solar cell.

As can be seen in FIG. 7, the LBAR 710 has a wide spatial extent formed from ordered GaInP (o-GaInP) placed in the space-charge region 740 of a disordered GaInP base 744. Subcells may also have AlGaInP forming part or all of the subcell base, with other parts of the solar cell, such as the emitter and other parts of the base, composed of GaInP, in order to retain the better minority-carrier recombination properties, and better minority-carrier and majority-carrier mobility properties, that GaInP often has in practice compared to AlGaInP. Subcells may also have AlGaInP forming part or all of the subcell base, incorporating LBARs incorporated into the solar cell base, emitter, or other parts of the solar cell, where the LBARs are formed from layers of GaInP, or AlGaInP with Al-composition lower than in other parts of the solar cell, Subcells using lattice-matched LBARs based on order/disordered phenomena may also be implemented in AlGaInP solar cells, and in solar cells with other base materials that exhibit bandgap changes due to sublattice ordering. The relationships between bandgap and lattice constant of the LBAR layer or layers and other device layers are diagrammed in FIG. 7, for the particular example of subcell 700, but other relationships between bandgap and lattice constant are possible and are included in the present disclosure.

Figure 8:
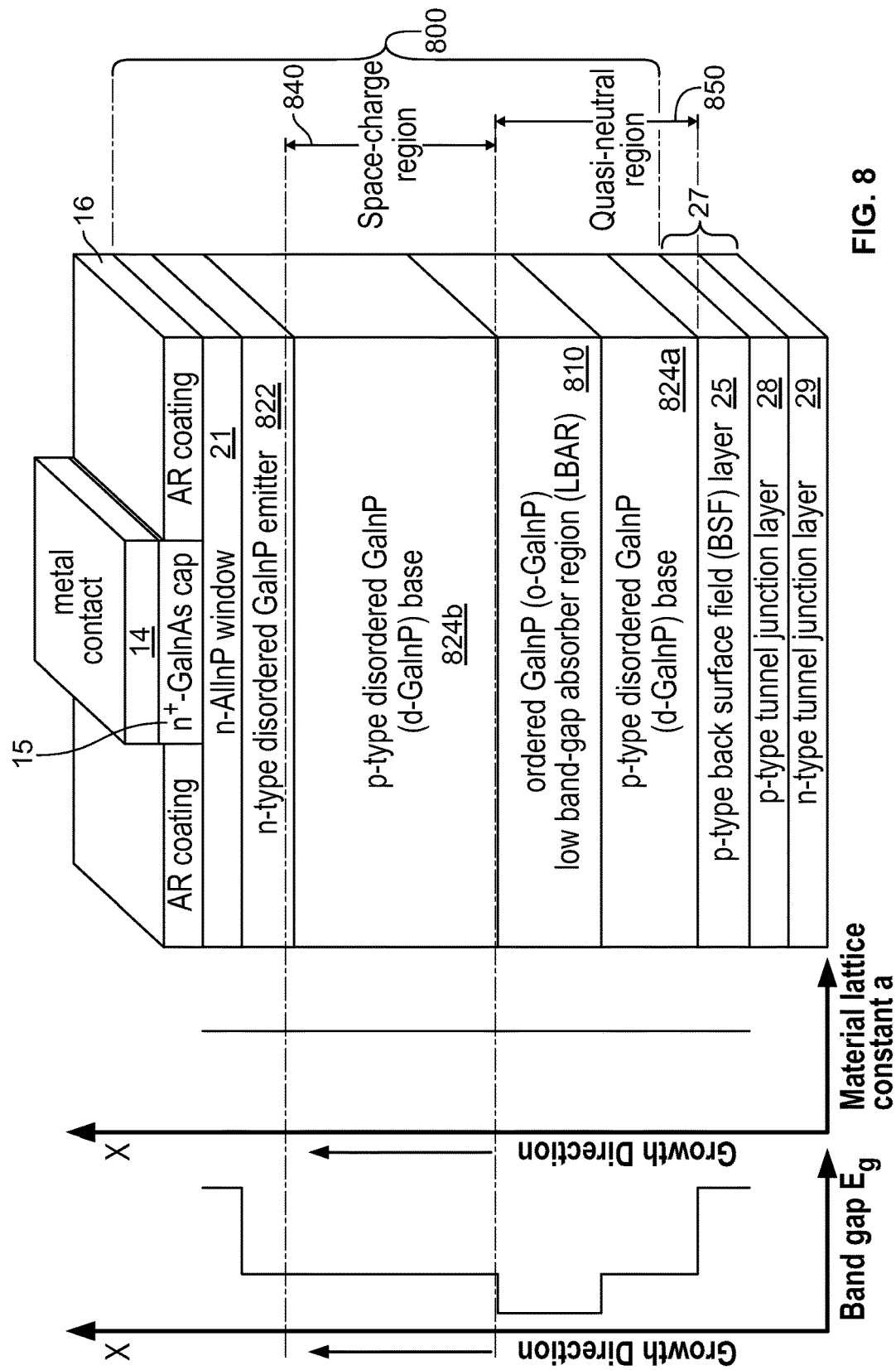
FIG. 8 illustrates another embodiment of a subcell according to an embodiment of the disclosure.

FIG. 8 illustrates another embodiment of a metamorphic subcell 800 according to the disclosure. In this exemplary embodiment, the subcell 800 is a top cell, having a similar configuration as top cell 20 in FIG. 1. As can be seen in FIG. 8, the subcell 800 has an antireflective coating 16 deposited a top the subcell 800 and a p-n junction 27 deposited below the subcell 800 The subcell 800 has been gown in a direction away from a substrate (not shown). In an embodiment, the subcell 800 may be the top cell 40 of 3-junction solar cell.

As can be seen in FIG. 8, the LBAR 810 has a wide spatial extent formed from ordered GaInP (o-GaInP) placed in the quasi-neutral region 850 of a disordered GaInP base 844. Subcells may also have AlGaInP forming part or all of the subcell base, with other parts of the solar cell, such as the emitter and other parts of the base, composed of GaInP, in order to retain the better minority-carrier recombination properties, and better minority-carrier and majority-carrier mobility properties, that GaInP often has in practice compared to AlGaInP. Subcells may also have AlGaInP forming part or all of the subcell base, incorporating LBARs incorporated into the solar cell base, emitter, or other parts of the solar cell, where the LBARs are formed from layers of GaInP, or AlGaInP with Al-composition lower than in other parts of the solar cell, Subcells using lattice-matched LBARs based on order/disordered phenomena may also be implemented in AlGaInP solar cells, and in solar cells with other base materials that exhibit bandgap changes due to sublattice ordering. The relationships between bandgap and lattice constant of the LBAR layer or layers and other device layers are diagrammed in FIG. 8, for the particular example of subcell 800, but other relationships between bandgap and lattice constant are possible and are included in the present disclosure.

Figure 9:
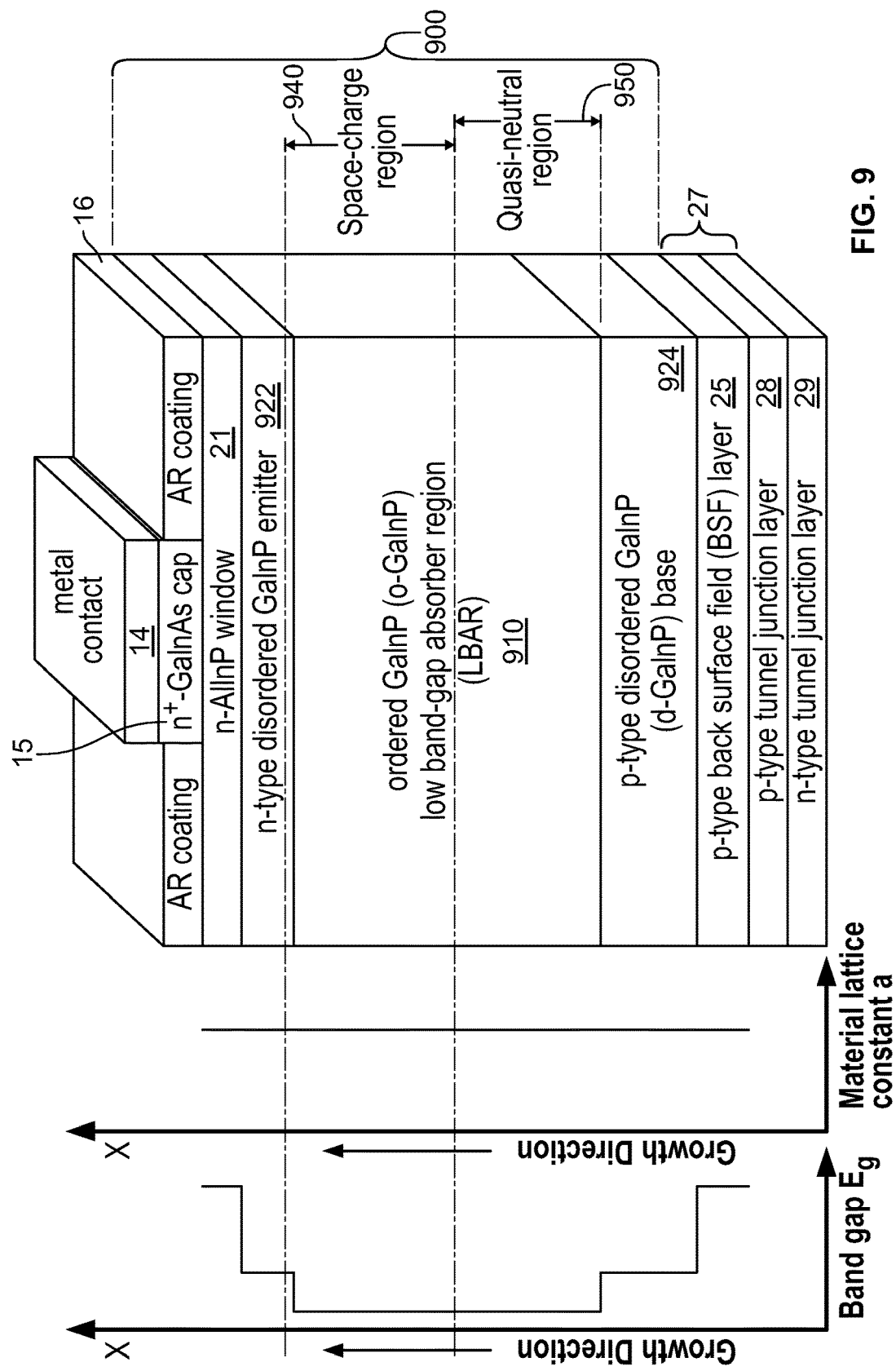
FIG. 9 illustrates another embodiment of a subcell according to an embodiment of the disclosure.

FIG. 9 illustrates another embodiment of a metamorphic subcell 900 according to the disclosure. In this exemplary embodiment, the subcell 900 is a top cell, having a similar configuration as top cell 20 in FIG. 1. As can be seen in FIG. 9, the subcell 900 has an antireflective coating 16 deposited a top the subcell 900 and a p-n junction 27 deposited below the subcell 900 The subcell 900 has been gown in a direction away from a substrate (not shown). In an embodiment, the subcell 900 may be the top cell 40 of 3-junction solar cell.

As can be seen in FIG. 9, the LBAR 910 has a wide spatial extent formed from ordered GaInP (o-GaInP) placed partially in the space-charge region 940 and partially in the quasi-neutral region 950 of a disordered GaInP base 944. Subcells may also have AlGaInP forming part or all of the subcell base, with other parts of the solar cell, such as the emitter and other parts of the base, composed of GaInP, in order to retain the better minority-carrier recombination properties, and better minority-carrier and majority-carrier mobility properties, that GaInP often has in practice compared to AlGaInP Subcells may also have AlGaInP forming part or all of the subcell base, incorporating LBARs incorporated into the solar cell base, emitter, or other parts of the solar cell, where the LBARs are formed from layers of GaInP, or AlGaInP with Al-composition lower than in other parts of the solar cell, Subcells using lattice-matched LBARs based on order/disordered phenomena may also be implemented in AlGaInP solar cells, and in solar cells with other base materials that exhibit bandgap changes due to sublattice ordering. The relationships between bandgap and lattice constant of the LBAR layer or layers and other device layers are diagrammed in FIG. 9, for the particular example of subcell 900, but other relationships between bandgap and lattice constant are possible and are included in the present disclosure.

Figure 10:
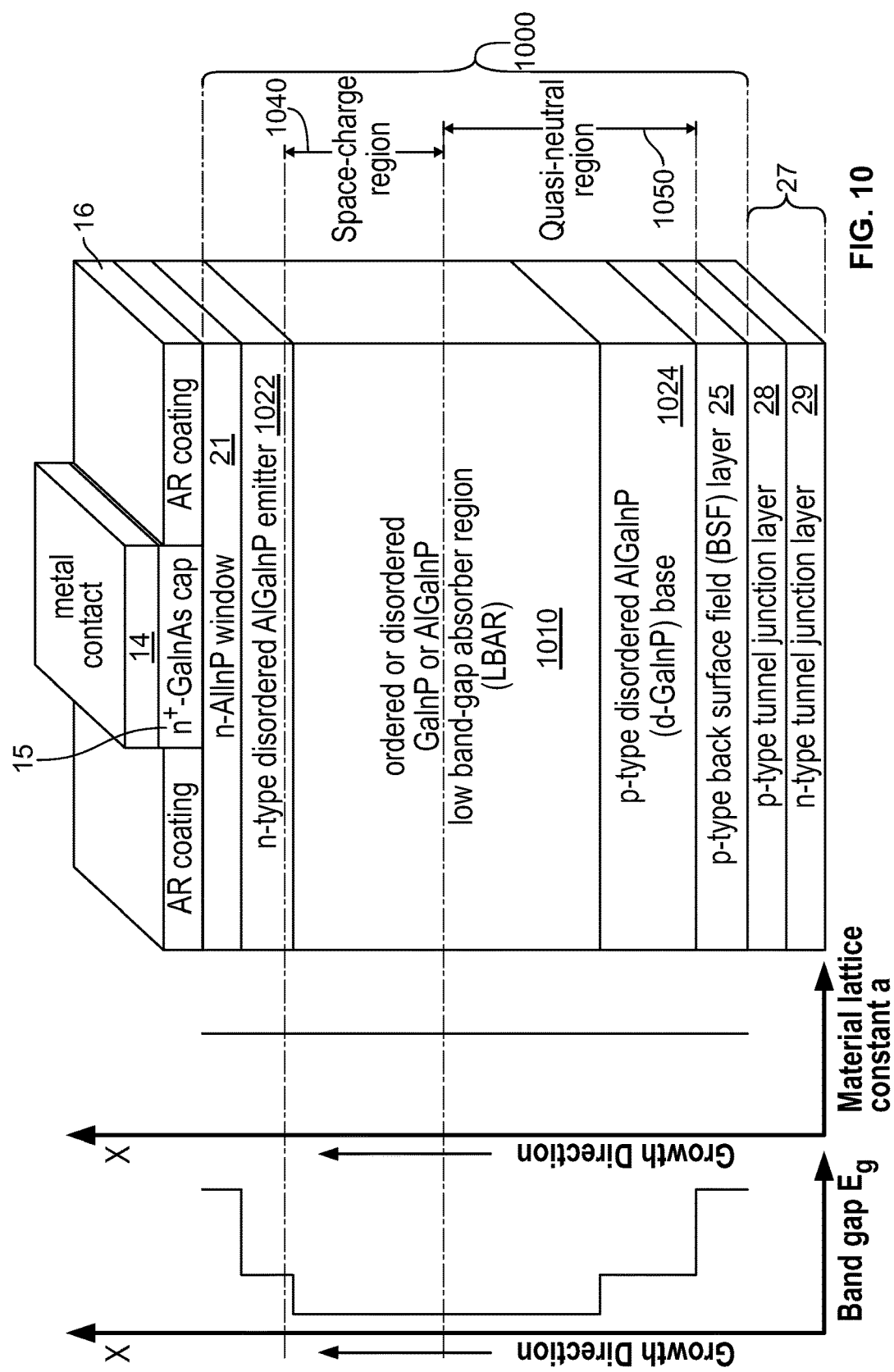
FIG. 10 illustrates another embodiment of a subcell according to an embodiment of the disclosure.

FIG. 10 illustrates another embodiment of a metamorphic subcell 1000 according to the disclosure. In this exemplary embodiment, the subcell 1000 is a top cell, having a similar configuration as top cell 20 in FIG. 1. As can be seen in FIG. 9, the subcell 1000 has an antireflective coating 16 deposited a top the subcell 1000 and a p-n junction 27 deposited below the subcell 1000 The subcell 1000 has been gown in a direction away from a substrate (not shown). In an embodiment, the subcell 1000 may be the top cell 40 of 3-junction solar cell.

As can be seen in FIG. 10, the LBAR 1010 has a wide spatial extent formed from ordered or disordered GaInP or AlGaInP placed partially in the space-charge region 1040 and partially in the quasi-neutral region 1050 of a disordered AlGaInP base 1044. Subcells may have AlGaInP forming part or all of the subcell base, incorporating LBARs incorporated into the solar cell base, emitter, or other parts of the solar cell, where the LBARs are formed from layers of GaInP, or AlGaInP with Al-composition lower than in other parts of the solar cell, Subcells using lattice-matched LBARs based on order/disordered phenomena may also be implemented in AlGaInP solar cells, and in solar cells with other base materials that exhibit bandgap changes due to sublattice ordering. The relationships between bandgap and lattice constant of the LBAR layer or layers and other device layers are diagrammed in FIG. 10, for the particular example of subcell 1000, but other relationships between bandgap and lattice constant are possible and are included in the present disclosure.

Subcells may have AlGaInP forming part or all of the subcell base, with other parts of the solar cell, such as the emitter and other parts of the base, composed of GaInP, in order to retain the better minority-carrier recombination properties, and better minority-carrier and majority-carrier mobility properties, that GaInP often has in practice compared to AlGaInP. The GaInP layer with improved minority-carrier and/or majority-carrier properties may make take up the entire width of the solar cell emitter, so that it constitutes the solar cell emitter. The GaInP layer with improved minority-carrier and/or majority-carrier properties may also make up part or all of the solar cell base or of other layers in the solar cell.

LBARs may be placed in the emitter region of a solar cell. The LBAR or LBARs may be placed in the space-charge region associated with the solar cell emitter, in the quasi-neutral region of the solar cell emitter, partly in the space-charge region and partly in the quasi-neutral region of the solar cell emitter, it may take up the entire width of the solar cell emitter, so that it constitutes the solar cell emitter, an in general the LBAR or LBARs may have portions in the quasi-neutral region of the emitter, space-charge region of the emitter, space-charge region of the base, and/or in the quasi-neutral region of the base. The collection of carriers with be aided by the electric field in the space-charge region, but current collection from carrier diffusion can still be quite appreciable and beneficial for LBARs positioned in the quasi-neutral regions, particularly those portions of the quasi-neutral regions adjacent to the space-charge region.

Figure 11:
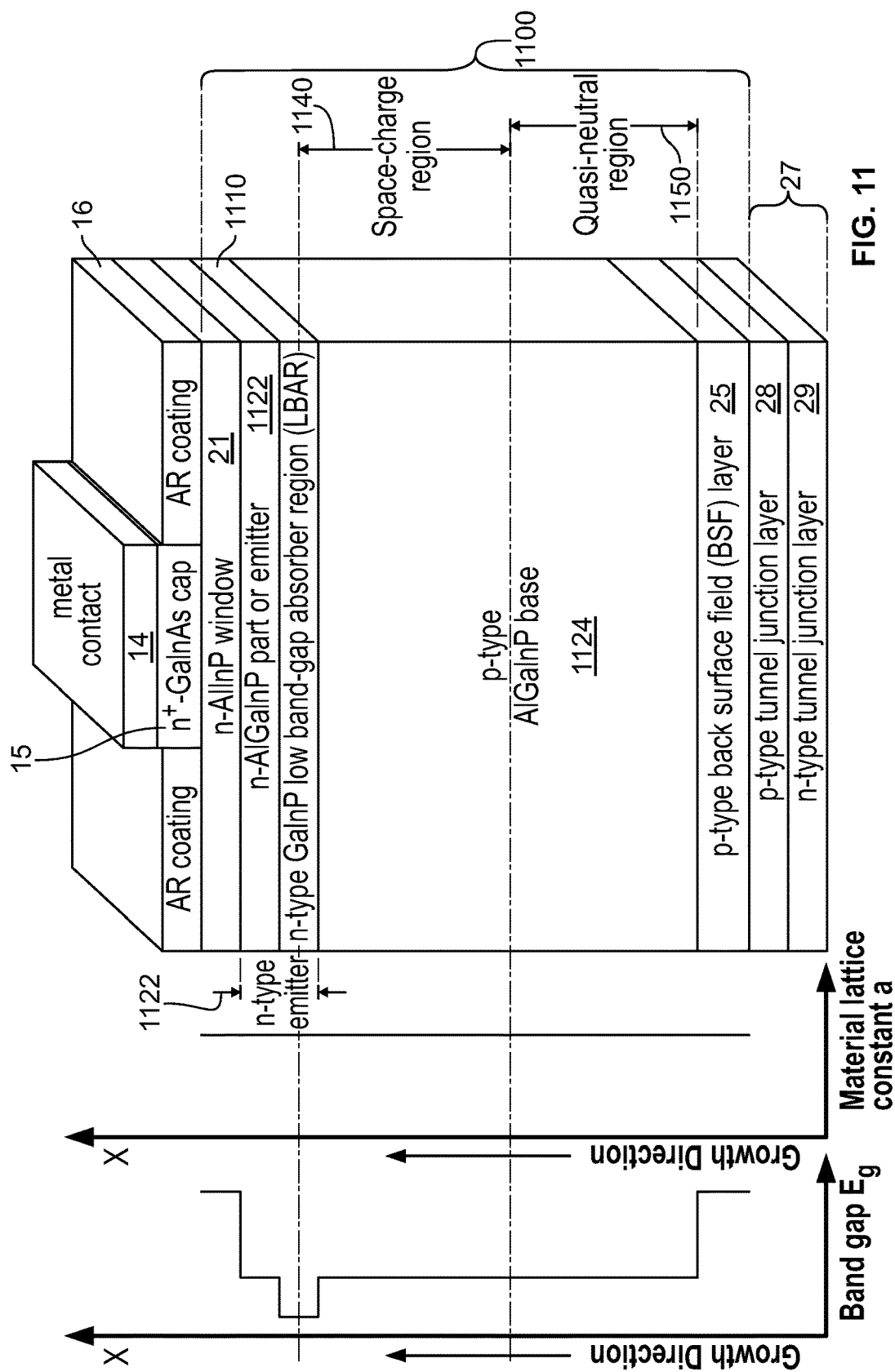
FIG. 11 illustrates another embodiment of a subcell according to an embodiment of the disclosure.

FIG. 11 illustrates another embodiment of a metamorphic subcell 1100 according to the disclosure. In this exemplary embodiment, the subcell 1100 is a top cell, having a similar configuration as top cell 20 in FIG. 1. As can be seen in FIG. 11, the subcell 1100 has an antireflective coating 16 deposited a top the subcell 1100 and a p-n junction 27 deposited below the subcell 1100 The subcell 1100 has been gown in a direction away from a substrate (not shown). In an embodiment, the subcell 1100 may be the top cell 40 of 3-junction solar cell.

As can be seen in FIG. 11, the LBAR 1110 is formed from n-type GaInP, which forms part of the n-type emitter 1122 in a subcell 100 with a AlGaInP base 1144, and which can be lattice-matched or pseudomorphically strained with respect to the AlGaInP base 1144 and tot the rest of the n-type emitter 1122. The relationships between bandgap and lattice constant of the LBAR layer or layers and other device layers are diagrammed in FIG. 11, for the particular example of subcell 1100, but other relationships between bandgap and lattice constant are possible and are included in the present disclosure.

Figure 12:
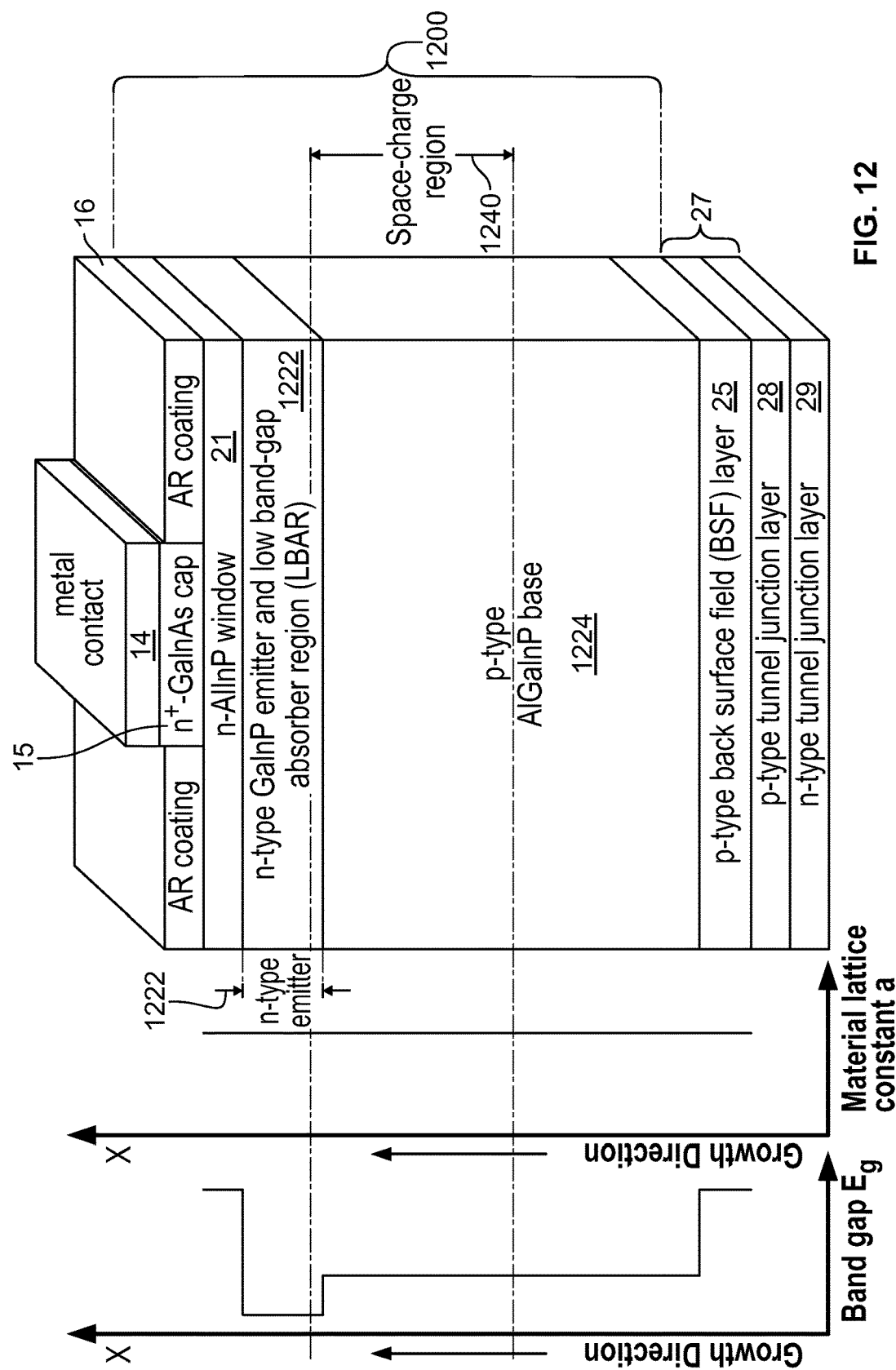
FIG. 12 illustrates another embodiment of a subcell according to an embodiment of the disclosure.

FIG. 12 illustrates another embodiment of a metamorphic subcell 1200 according to the disclosure. In this exemplary embodiment, the subcell 1200 is a top cell, having a similar configuration as top cell 20 in FIG. 1. As can be seen in FIG. 12, the subcell 1200 has an antireflective coating 16 deposited a top the subcell 1200 and a p-n junction 27 deposited below the subcell 1200 The subcell 1200 has been gown in a direction away from a substrate (not shown). In an embodiment, the subcell 1200 may be the top cell 40 of 3-junction solar cell.

As can be seen in FIG. 12, the LBAR 1210 is formed from n-type GaInP, which takes up the entire width of the emitter 1222, and thus forms the entire n-type emitter in the subcell 1200 with an AlGaInP base 1244. AlGaInP can have a significantly lower minority hole diffusion length than GaInP, due to both lower hole mobility and lower minority hole lifetime in n-type AlGaInP. Using GaInP for the emitter 1222 of the subcell 1200 with an AlGaInP base 1244 can substantially increase the current density of the solar cell, particularly the short wavelength (blue) response of the subcell 1200. This occurs not only because of the lower bandgap of the LBAR 1210, but also because of the significant advantages described above for minority carrier collection in aluminum-free materials such as GaInP used for the entire emitter 1222 of AlGaInP-based solar cells. The relationships between bandgap and lattice constant of the LBAR layer or layers and other device layers are diagrammed in FIG. 11, for the particular example of subcell 1100, but other relationships between bandgap and lattice constant are possible and are included in the present disclosure.

In addition to metamorphic multijunction solar cells in which all of the subcells are grown upright, i.e. with all the subcells grown upright, i.e., with all the subcells grown starting with the layers away from the sunward surface, and finishing with the layers that are toward the sunward surface, another important type of metamorphic multijunction solar cell employs inverted metamorphic (IMM) solar cells, in which the layers sunward surface of the inverted (upside-down) subcells are grown first, and the layers away from the sunward surface are grown first.

Figure 13:
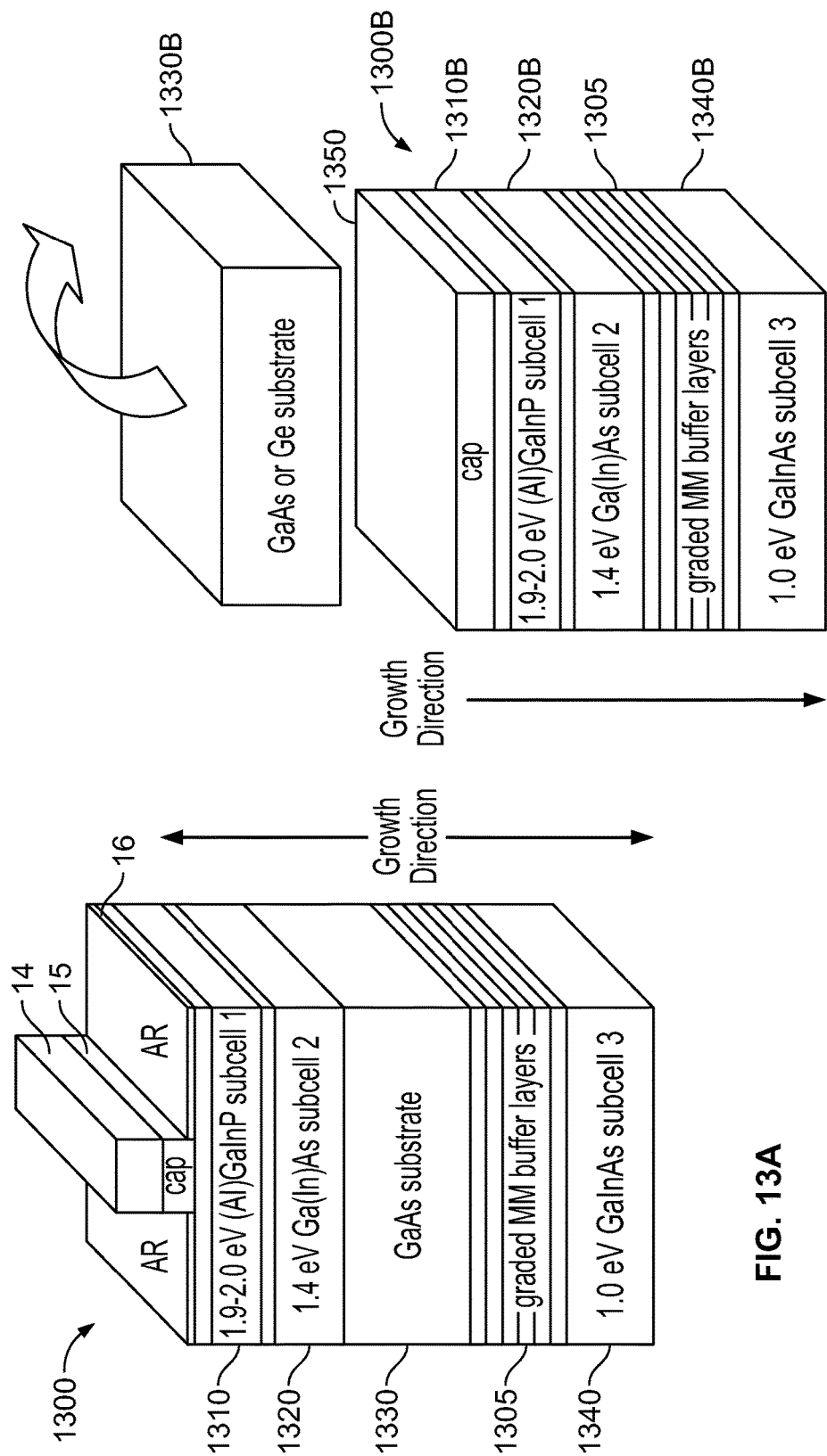
FIG. 13 illustrates another embodiment of a subcell according to an embodiment of the disclosure.

FIGS. 13A and 13B illustrate two architectures of 3-junction solar cells employing inverted metamorphic 1-eV solar cells. In FIG. 13A, a solar cell 1300 is shown in which the upper two subcells, a GaInP subcell 1 1310 and a GaAs subcell 2 1320, are grown upright, and lattice-matched to a transparent GaAs substrate 1330, and with an inverted metamorphic approx. 1-eV GaInAs solar cell subcell 3 1340 grown on the opposite side of the transparent GaAs substrate 1330.

In FIG. 13B, a solar cell 1300B is shown in which the upper two subcells a GaInP subcell 1 1310A and GaAs subcell 2 1320B, are inverted lattice-matched (ILM) solar cells, grown inverted and lattice-matched to a substrate 1330B, which may be GaAs or Ge, and followed by growth of an inverted metamorphic approximately 1-eV GaInAs solar subcell 3 1340B. The substrate 1330B is later removed (as shown) during subsequent processing to allow sunlight to enter the sunward surface 1350 of the solar cell 1300B.

LBARs may be used in inverted metamorphic solar cells to extend the wavelength response of such solar cells, thereby in a more optimal combination of the effective bandgaps of the subcells in a multijunction solar cell for efficient conversion of the solar spectrum. As discussed above, it can be highly beneficial to be able to achieve improved long wavelength response in a metamorphic solar cell, without having to increase the lattice constant and lattice mismatch with respect to the substrate, which tends to increase high dislocation density and recombination rate in the metamorphic solar cell. This is a strong advantage for inverted metamorphic solar cells, which are often highly lattice mismatched to the growth substrate, and which are often the subcells with the lowest bandgaps in the multijunction structure, e.g., in the 0.6 to 1.1 eV bandgap range, and frequently in the 0.7 to 1.0 eV range.

Figure 14:
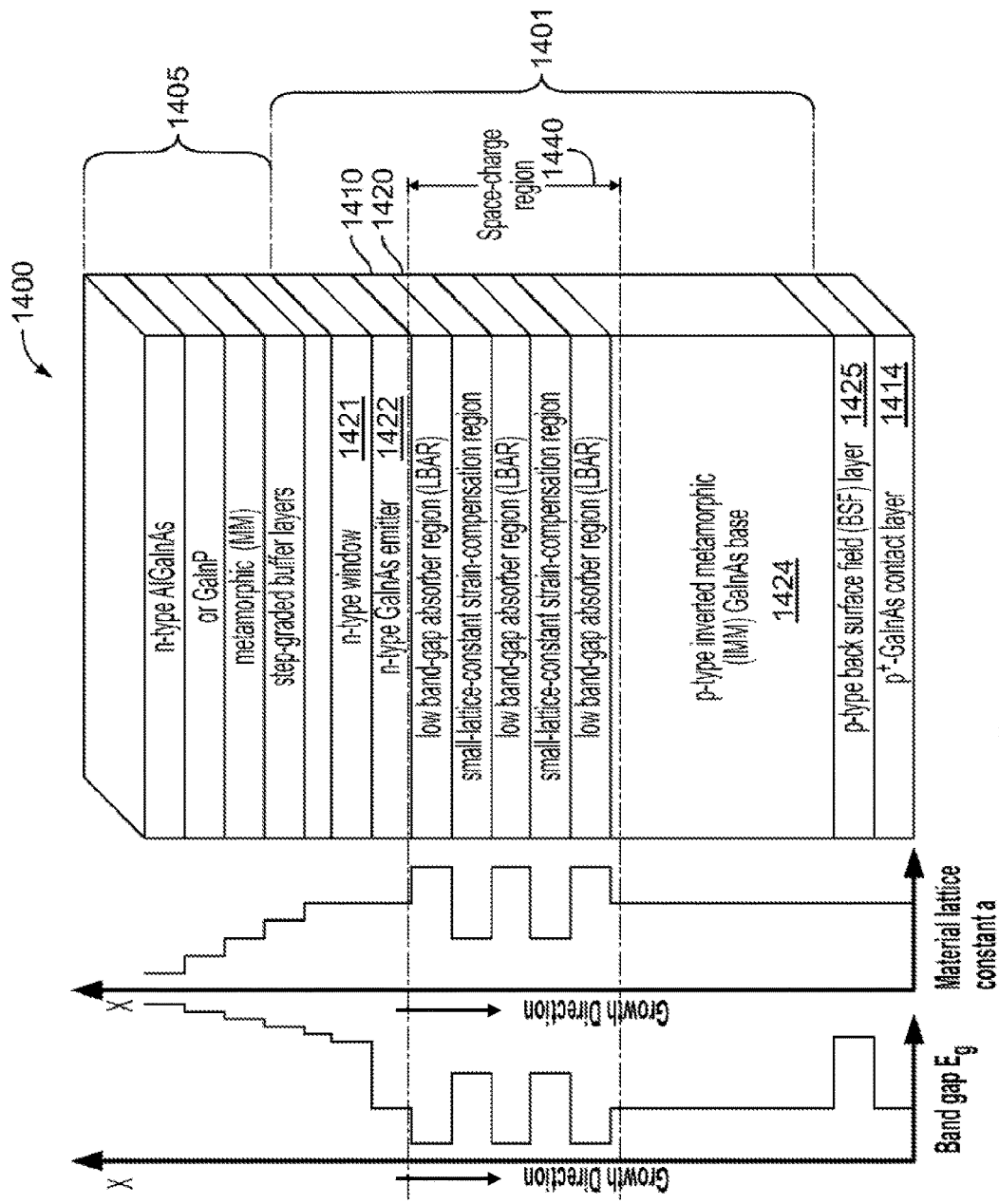
FIG. 14 illustrates another embodiment of a subcell according to an embodiment of the disclosure.

FIG. 14 illustrates a solar cell 1400 having LBARs 1410 and SCRs 1420 are placed in the space-charge region 1440 of an inverted metamorphic GaInAs solar cell 1401. In this case, the LBARs 1410 may be high-indium-composition GaInAs layers, and, owing to the metamorphic composition and relatively high indium content in the GaInAs solar cell base 1444, low-indium-composition layers may be used for the SCRs 1420, in a strain-balanced configuration.

As described above, semiconductors such as dilute nitride GaNAs, GaInNAs, and GaInNAsSb and some other semiconductors exhibit a decrease in bandgap as the lattice constant is decreased. This allows the construction of an LBAR/SCR structure in inverted metamorphic solar cells such that both the LBARs and the SCRs have a lower bandgap than the solar cell base, thus maximizing the thickness available for light absorption and increased current photogeneration, and removing high bandgap barriers to current flow. The bandgap in the LBARs and in the SCRs may be made approximately equal to each other if desired.

As further described above, it may be desirable in some cases to separate certain elements from others, to avoid undesirable interactions in the crystal lattice that cause increased recombination, e.g., the formation of In—N pairs in GaInNAs, or to avoid gas phase reactions during growth, by introducing reactive precursor gases into the reaction chamber at different times. This can be accomplished by using the LBAR/SCR structure described above in inverted metamorphic solar cells, e.g., with pseudomorphic high-In GaInAs LBARs combined with pseudomorphic Ga(In)NAs SCRs in the metamorphic GaInAs base or elsewhere in the inverted metamorphic cell, achieving a low bandgap region, but with lower recombination rate due to the separation of In and N in some or all of the layers.

Figure 15:
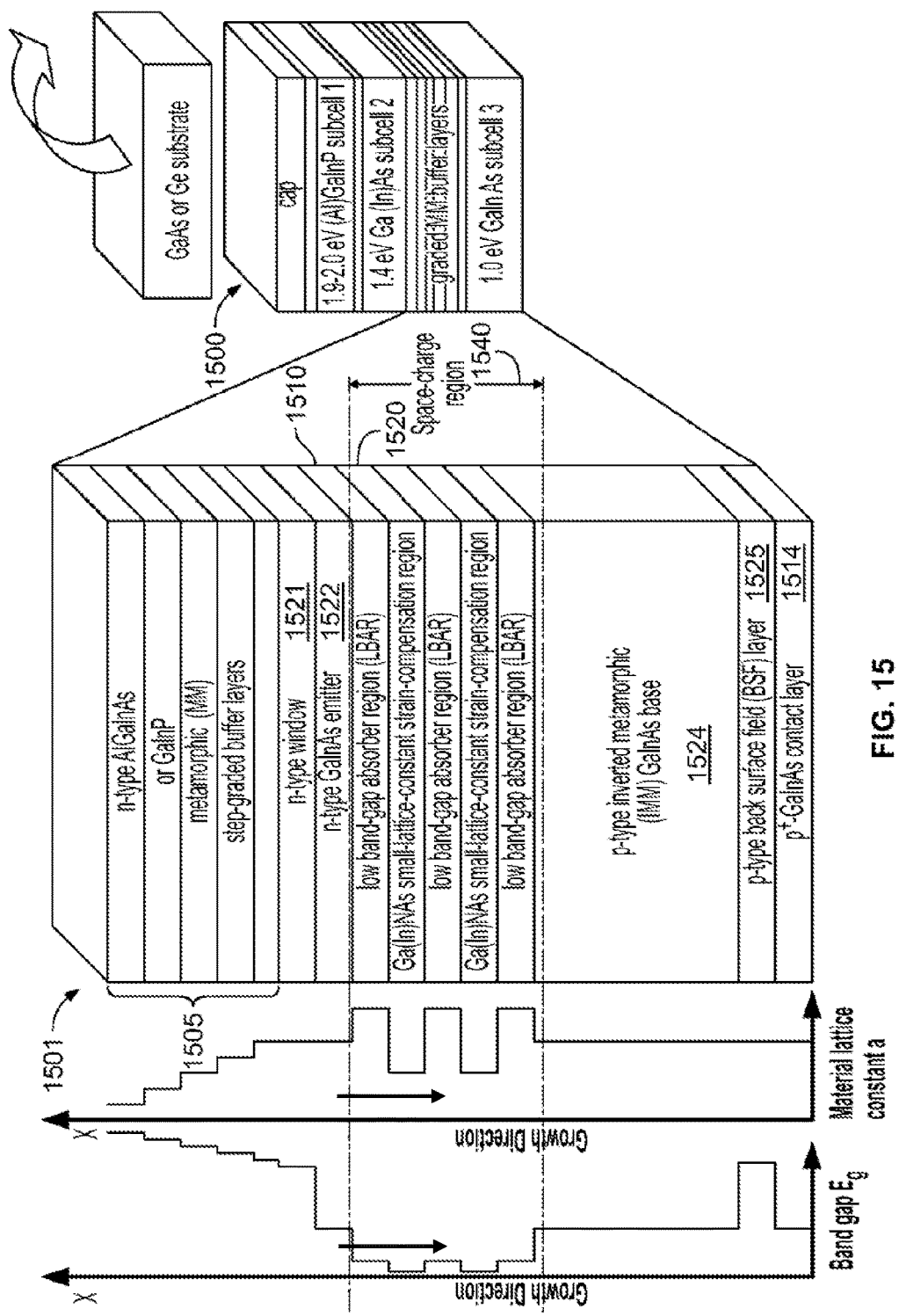
FIG. 15 illustrates another embodiment of a subcell according to an embodiment of the disclosure.

FIG. 15 illustrates a solar cell 1500 including a subcell 1501 having LBARs 1510 and SCRs 1520. The LBARs 1510 are high-indium-content GaInAs layers. The SCRs 1520 are also LBARs with a bandgap lower than that of the subcell base 1544, e.g., dilute nitride Ga(In)NAs(Sb) layers where the elements in parenthesis are optional, placed in the space-charge region 1540 of an inverted metamorphic GaInAs solar cell 1500. In this case, a wide region of the semiconductor can have a low bandgap compared to the solar cell base 1544, forming a wide LBAR with high light absorptance and high photogeneration, even though the LBAR is formed from components that can have a relatively high lattice-mismatch with respect to the inverted metamorphic solar cell base 1544.

Figure 16:
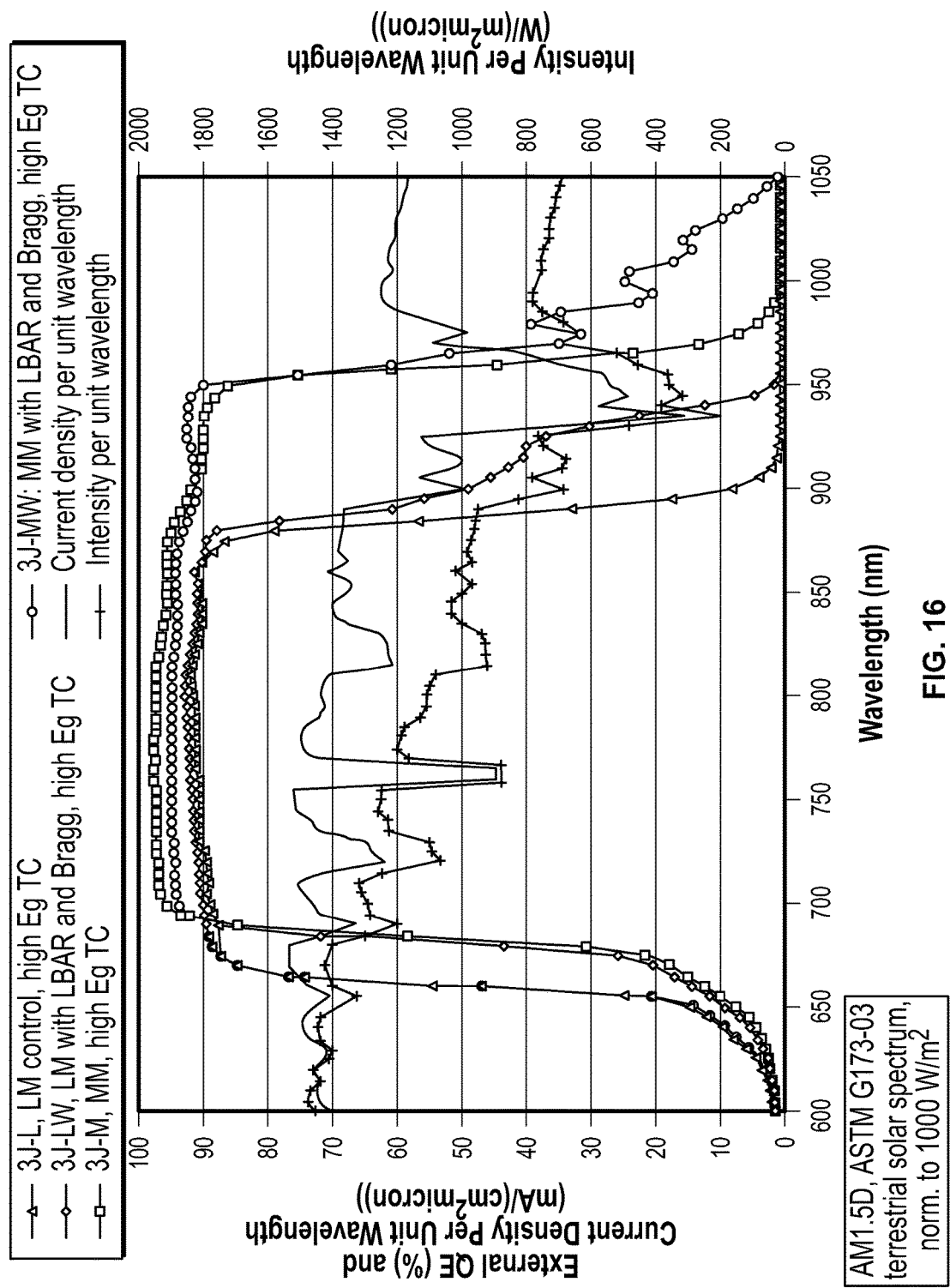
FIG. 16 is a chart illustrating comparative performance data for solar cells of various configurations.

FIG. 16 is a chart illustrating the relationship between various solar cell configurations and performance. The measured external quantum efficiency as a function of wavelength is compared for cells with the following designs, as indicated in the legend of the figure:

3J-L: Lattice-matched 3-junction solar cell, no LBARs or Bragg reflector
3J-LW: Lattice-matched 3-junction solar cell, with LBARs and Bragg reflector
3J-M: Metamorphic 3-junction solar cell, no LBARs or Bragg reflector
3J-MW: Metamorphic 3-junction solar cell, with LBARs and Bragg reflector.

In addition, the current density per unit wavelength corresponding to the photon flux in the AM1.5 Direct, ASTM G173-03 solar spectrum, the standard solar spectrum used for evaluating and characterizing concentrator photovoltaic (CPV) solar cells, is normalized to an intensity of 1000 watts/cm$^2$ and plotted in the figure as a function of wavelength, for comparison to the measured external quantum efficiency (EQE) of the cells. Furthermore, the intensity per unit wavelength corresponding to the standard AM1.5 Direct, ASTM G173-03 solar spectrum, normalized to 1000 watts/cm$^2$ total intensity, is also plotted as a function of wavelength in the figure for comparison.

The experimental solar cell configurations in FIG. 16 are as follows. The curve labeled 3J-L is the measured EQE of a 1%-In GaInAs middle cell, or cell 2, from a lattice-matched (LM) 3-junction (3J) GaInP/GaInAs/Ge solar cell design, with the same or nearly the same lattice constant as the Ge growth substrate, and represents a lattice-matched control case with no low-bandgap absorber regions (LBARs) or Bragg reflector incorporated into the cell. Other substrates, such as GaAs, InP, Si, GaP, GaSb, InAs, InSb, GaN, SiC, SiGe, and $Al_2O_3$, may also be used. Other solar cell materials, such as AlGaInAs, AlGaAs, GaInP, GaPAs, GaInPAs, AlGaInP, AlInP, GaAsSb, GaInAsSb, InPAs, AlInAs, AlGaPAs, AlInPAs, AlAsSb, AlGaInSb, AlGaAsSb, AlInAsSb, AlGaSb, InAsSb, GaInSb, AlInSb, AlGaN, AlInN, GaInN, SiGe, and SiGeSn, may also be used, for instance as the layers forming the base, emitter, back-surface field (BSF), window, intrinsic, LBAR, strain-compensation region (SCR), or barrier layers of subcells in a multijunction solar cell, or tunnel junction, buffer, nucleation, superlattice, Bragg or other type of reflector, anti-reflection (AR), lateral conduction, cap, contact, or other solar cell layers.

The curve labeled 3J-LW is again the measured EQE of the middle cell or cell 2 with a 1%-In GaInAs base, in a 3-junction GaInP/GaInAs/Ge solar cell design that is lattice-matched to the Ge growth substrate, but in this case a series of LBARs and small-lattice-constant strain-compensation layers, or barrier layers, have been incorporated into the space-charge region of the middle cell base, according to one or more of the embodiments described above. In the particular 3J-LW case shown in FIG. 16, the LBAR array comprises 12 LBAR layers with 8%-In GaInAs composition and thickness of 300 angstroms each, alternating with GaPAs small-lattice-constant strain-compensation layers, with composition and thickness chosen to create pseudomorphically-strained tensile barrier layers to balance the strain of the pseudomorphically-strained compressive LBAR layers, but other compositions and configurations are possible, as described in above in this specification for the present invention.

The effect of the array of LBARs on the measured external quantum efficiency and photogenerated current density of the middle subcell of the 3-junction solar cell in the 3J-LW case can be seen in FIG. 16. Compared with the lattice-matched control 3J-L case, the LBARs raise the EQE of the subcell from near zero to levels ranging from 0% to over 60% in the wavelength range corresponding to photon energies just below the bandgap of the 1%-In GaInAs portion of the solar cell base, which, for the example devices shown in FIG. 16, makes up all of the base in the 3J-L case, and the majority of the base in the 3J-LW case. This increased photogeneration in the wavelength range from approximately 890 nm to 950 nm allows some of the light energy incident on the cell that would generate photocarriers in the Ge bottom subcell, or cell 3, of the 3J-L multijunction cell configuration—where they would not be used productively because the Ge bottom subcell has excess photogenerated current density—to instead be used in the 1%-In GaInAs middle subcell, or cell 2, of the multijunction cell, where the photogenerated carriers from these photon energies can be used to advantage, because the 1%-In GaInAs middle subcell need not have excess current density, and has higher bandgap and voltage than the Ge bottom subcell, thus increasing the overall multijunction solar cell efficiency.

The range of wavelengths of absorption from the array of LBARs in the subcell may be tailored with respect to features in the incident solar spectrum, at the particular subcell base and LBAR bandgaps corresponding to a particular cell temperature. For instance, in the 3J-LW case in FIG. 16, the LBAR absorption is in a wavelength range, approximately 890 nm to 950 nm, with the strongest absorption occurring from about 890 nm to 935 nm, for which there is ample photon flux and corresponding current density available in the example AM1.5 Direct (AM1.5D) spectrum shown in FIG. 16. This wavelength range is chosen to avoid the gap in available intensity, photon flux, and current density in the spectrum at slightly longer wavelengths, from about 930 nm to 970 nm, with the lowest values from about 935 nm to 965 nm, in which there would be less current density collected for this particular spectrum and cell temperature, and less advantage for the solar cell efficiency, if the LBAR bandgaps were tuned to absorb in this wavelength range instead.

The extension of the long-wavelength response of the solar cell due to the array of LBARs, to increase the photogenerated current density of that solar cell, which may be a subcell in a multijunction solar cell, can be used in general to optimize the current balance among subcells in the multijunction solar cell for a typical range of incident spectra and range of solar cell temperatures, thus increasing the efficiency of the multijunction solar cell, improving its ease of manufacturability, and/or reducing its cost of manufacture, according to one or more embodiments of the present invention. The particular example of a 3-junction solar cell with 2-dimensional (2D) LBARs in the space-charge region of the middle subcell, or cell 2, is shown in FIG. 16. But the principle of using 0-dimensional (0D), 1-dimensional (1D), or 2-dimensional (2D) LBARs to optimize the current balance among subcells in a multijunction cell in the present invention, with the LBARs placed in the quasi-neutral regions, or other regions or combinations of other regions of the device, in the top subcell, bottom subcell, or other subcells of the multijunction solar cell or other optoelectronic device, to improve its efficiency or performance in a way that could not easily be accomplished otherwise, can be applied to 2-junction solar cells, as well as to 4-junction cells, 5-junction cells, 6-junction cells, and solar cells with 7 or more junctions, and to other optoelectronic devices.

In addition, in the 3J-LW case, a Bragg reflector composed of alternating AlGaAs and GaAs layers has been positioned at the back of the middle cell, where the thicknesses and compositions of the Bragg reflector layers have been chosen to give high reflection for the range of wavelengths corresponding to photon energies just below the bandgap of most of the middle cell base, and in the range of wavelengths most strongly absorbed by the array of LBARs in the space-charge region of the middle cell base, thus increasing the path length of light through the LBARs where light absorption and carrier photogeneration is desired. In FIG. 16, in the particular case of the 3J-LW cell, 19 periods of alternating AlGaAs and GaAs layers have been used to create the stack of layers with alternating low and high indices of refraction to create the Bragg reflector structure. The layers of the Bragg reflector may be incorporated into the structure of the back-surface field (BSF) layers, metamorphic buffer layers, and/or tunnel junction layers that may also be located at the back of the solar cell base, so that some or all of the Bragg reflector layers may perform these functions in the solar cell in addition to their optical reflection function.

The next example 3-junction cell configurations in FIG. 16 are metamorphic cases, in which the upper two subcells, the GaInP top subcell or cell 1, and the GaInAs middle subcell or cell 2, are grown relaxed at a new lattice-constant different from that of the Ge growth substrate, by virtue of a GaInAs metamorphic buffer which transitions from the smaller lattice constant of the growth substrate, to the larger material lattice constant of the active subcell materials. The metamorphic buffer accommodates the misfit dislocations associated with this change in lattice constant within the metamorphic buffer, where minority-carrier properties are relatively unimportant and majority-carrier transport is of main importance, and limits the formation and propagation threading dislocation segments into the active solar cell regions, where minority-carrier transport properties such as lifetime, mobility, and diffusion length are of paramount importance to the efficiency of the solar cell. Other substrates, such as GaAs, InP, Si, GaP, GaSb, InAs, InSb, GaN, SiC, SiGe, and $Al_2O_3$, may also be used. Other solar cell materials, such as AlGaInAs, AlGaAs, GaInP, GaPAs, GaInPAs, AlGaInP, AlInP, GaAsSb, GaInAsSb, InPAs, AlInAs, AlGaPAs, AlInPAs, AlAsSb, AlGaInSb, AlGaAsSb, AlInAsSb, AlGaSb, InAsSb, GaInSb, AlInSb, AlGaN, AlInN, GaInN, SiGe, and SiGeSn, may also be used, for instance as the layers forming the base, emitter, back-surface field (BSF), window, intrinsic, LBAR, strain-compensation region (SCR), or barrier layers of subcells in a multijunction solar cell, or tunnel junction, buffer, nucleation, superlattice, Bragg or other type of reflector, anti-reflection (AR), lateral conduction, cap, contact, or other solar cell layers. Other metamorphic buffer materials, such as AlGaInAs, AlGaAs, GaInP, GaPAs, GaInPAs, AlGaInP, AlInP, GaAsSb, GaInAsSb, InPAs, AlInAs, AlGaPAs, AlInPAs, AlAsSb, AlGaInSb, AlGaAsSb, AlInAsSb, AlGaSb, InAsSb, GaInSb, AlInSb, AlGaN, AlInN, GaInN, SiGe, and SiGeSn, may also be used.

The curve labeled 3J-M is the measured EQE of a 8%-In GaInAs middle cell, or cell 2, from a metamorphic (MM), or lattice-mismatched 3-junction (3J) GaInP/GaInAs/Ge solar cell design, with the upper two subcells grown at a different lattice constant than that of the Ge growth substrate, by virtue of a GaInAs metamorphic buffer, as described above. The 3J-M case represents a metamorphic (MM) baseline case, with no low-bandgap absorber regions (LBARs) or Bragg reflector incorporated into the cell.

The curve labeled 3J-MW is again the measured EQE of the middle cell or cell 2 with a 8%-In GaInAs base, in a metamorphic 3-junction GaInP/GaInAs/Ge solar cell design with the upper two subcells having a material lattice constant that is different than that of the Ge growth substrate, but in this case a series of metamorphic LBARs and metamorphic, small-lattice-constant strain-compensation layers, or barrier layers, have been incorporated into the space-charge region of the middle cell base, according to one or more of the embodiments described above. In the particular 3J-MW case shown in FIG. 16, the LBAR array comprises 8 LBAR layers with 18%-In GaInAs composition and thickness of 250 angstroms each, alternating with GaAs small-lattice-constant strain-compensation layers, with compositions chosen from the same 3-element or ternary GaInAs material system, according to one or more embodiments of the present invention. The thicknesses of the GaAs layers are chosen to create pseudomorphically-strained tensile barrier layers to balance the strain of the pseudomorphically-strained compressive LBAR layers, all at the larger lattice constant at or near that of the metamorphic subcell base, and different from the lattice constant of the growth substrate. Other compositions and configurations are possible, as described in above in this specification for the present invention.

The effect of the array of metamorphic LBARs on the measured external quantum efficiency and photogenerated current density of the metamorphic middle subcell of the 3-junction solar cell in the 3J-MW case can be seen in FIG. 16. Compared with the metamorphic baseline 3J-M case, the LBARs raise the EQE of the subcell from near zero to levels ranging from 0% to over 60% in the wavelength range corresponding to photon energies just below the bandgap of the 8%-In GaInAs portion of the metamorphic solar cell base, which, for the example devices shown in FIG. 16, makes up all of the base in the 3J-M case, and the majority of the base in the 3J-MW case. This increased photogeneration in the wavelength range from approximately 960 nm to 1050 nm makes it possible to tune the current density of the subcell which incorporates the LBARs, and that of the subcell beneath it, in order to use more of these photons in the higher bandgap, higher voltage subcell, and in general to tune the wavelength response of the subcell incorporating the LBARs to absorb lower photon energies, without the risks and disadvantages of moving to a greater lattice constant mismatch and lower bandgap in the majority of the base thickness, according to one or more embodiments in the present invention.

The range of wavelengths of absorption from the array of metamorphic LBARs in the subcell may be tailored with respect to features in the incident solar spectrum, at the particular subcell base and LBAR bandgaps corresponding to a particular cell temperature. For instance, in the 3J-MW case in FIG. 16, the LBAR absorption is in a wavelength range, approximately 960 nm to 1050 nm, for which there is ample photon flux and corresponding current density available in the example AM1.5 Direct (AM1.5D) spectrum shown in FIG. 16. This wavelength range is chosen to avoid the gap in available intensity, photon flux, and current density in the spectrum at slightly shorter wavelengths, from about 930 nm to 970 nm, with the lowest values from about 935 nm to 965 nm, in which there would be less current density collected for this particular spectrum and cell temperature, and less advantage for the solar cell efficiency, if the LBAR bandgaps were tuned to absorb in this wavelength range instead.

The extension of the long-wavelength response of the solar cell due to the array of metamorphic LBARs, to increase the photogenerated current density of that solar cell, which may be a metamorphic subcell in a multijunction solar cell, can be used in general to optimize the current balance among subcells in the metamorphic multijunction solar cell for a typical range of incident spectra and range of solar cell temperatures, thus increasing the efficiency of the multijunction solar cell, improving its ease of manufacturability, and/or reducing its cost of manufacture, according to one or more embodiments of the present invention. The particular example of a metamorphic 3-junction solar cell with 2-dimensional (2D) LBARs in the space-charge region of the metamorphic middle subcell, or cell 2, is shown in FIG. 16. But the principle of using 0-dimensional (0D), 1-dimensional (1D), or 2-dimensional (2D) metamorphic LBARs to optimize the current balance among subcells in a multijunction cell in the present invention, with the metamorphic LBARs placed in the quasi-neutral regions, or other regions or combinations of other regions of the device, in the metamorphic top subcell, metamorphic bottom subcell, or other metamorphic subcells of the multijunction solar cell or other optoelectronic device, to improve its efficiency or performance in a way that could not easily be accomplished otherwise, can be applied to 2-junction solar cells, as well as to 4-junction cells, 5-junction cells, 6-junction cells, and solar cells with 7 or more junctions, and to other optoelectronic devices.

In addition, in the 3J-MW case, a Bragg reflector composed of alternating AlGaInAs and GaInAs layers, at or near the shifted lattice constant of the metamorphic 8%-In GaInAs middle cell base, has been positioned at the back of the middle cell, where the thicknesses and compositions of the Bragg reflector layers have been chosen to give high reflection for the range of wavelengths corresponding to photon energies just below the bandgap of most of the metamorphic middle cell base, and in the range of wavelengths most strongly absorbed by the array of LBARs in the space-charge region of the metamorphic middle cell base, thus increasing the path length of light through the LBARs where light absorption and carrier photogeneration is desired. In FIG. 16, in the particular case of the 3J-MW cell, 16 periods of alternating AlGaInAs and GaInAs layers have been used to create the stack of layers with alternating low and high indices of refraction to create the metamorphic Bragg reflector structure at a lattice constant different than that of the growth substrate, with relaxed semiconductor layers, with a low density of threading dislocations. The layers of the metamorphic Bragg reflector may be incorporated into the structure of the back-surface field (BSF) layers, metamorphic buffer layers, and/or tunnel junction layers that may also be located at the back of the solar cell base, so that some or all of the Bragg reflector layers may perform these functions in the solar cell in addition to their optical reflection function.

Although a particular embodiment of the disclosure has been described in detail for purposes of illustration, various modifications and enhancements may be made without departing from the spirit and scope of the disclosure. Accordingly, the disclosure is not to be limited except as by the appended claims.

What is claimed is:

1. A lattice mismatched metamorphic semiconductor device having at least one subcell, the at least one subcell comprising:
    a base layer;
    an emitter layer in electrical connectivity with the base layer, wherein the base layer and emitter layer form a p-n junction in a photovoltaic cell or other optoelectronic device;
    a low bandgap absorber region disposed in either or both of the base layer and emitter layer, wherein the low bandgap absorber region has a higher photogeneration and a lower bandgap than surrounding semiconductor layers;
    wherein the low bandgap absorber region forms tensile and compressive regions having alternating smaller and larger lattice constants than that of an average lattice constant of the lattice mismatched metamorphic semiconductor device;
    wherein the low bandgap absorber region does not form a quantum well,
    wherein the subcell further comprises one or more small-lattice-constant strain-compensation regions adjacent to the low bandgap absorber region, wherein a lattice constant of the one or more strain compensation regions is less than the lattice constant of the low bandgap absorber region, wherein strain in the low bandgap absorber region is balanced by strain in the opposite direction by the strain compensation regions, the strain compensation regions having a larger bandgap than the low bandgap absorber region,
    wherein the low bandgap absorber region comprises: a 1-dimensional geometric configuration comprising one or more of a linear feature, a curved line, a plurality of discontinuous line-like features, or combinations thereof and wherein the strain compensation regions having a larger bandgap than the low bandgap absorber region encapsulating the 1-dimensional geometric configurations.

2. The semiconductor device of claim 1, wherein the low bandgap absorber region is incorporated into a space-charge region on one side of the p-n junction of the subcell.

3. The semiconductor device of claim 1, wherein the low bandgap absorber region is incorporated into a quasi-neutral region one one side of the p-n junction of the cell or device.

4. The semiconductor device of claim 1, wherein the low bandgap absorber region is incorporated into a space-charge region and a quasi-neutral region on one side of the p-n junction of the cell or device.

5. The semiconductor device of claim 1, wherein the low bandgap absorber region is incorporated into a space-charge region on both sides of the p-n junction of the subcell.

6. The semiconductor device of claim 1, wherein the low bandgap absorber region is incorporated into a space-charge region and a quasi-neutral region on both sides of the p-n junction of the cell or device.

7. The semiconductor device of claim 1, wherein the low bandgap absorber region is incorporated into a space-charge region of the base layer.

8. The semiconductor device of claim 1, wherein the low bandgap absorber region is incorporated into a space-charge region of the emitter layer.

9. The semiconductor device of claim 1, wherein the low bandgap absorber region is incorporated into a quasi-neutral region of the base layer.

10. The semiconductor device of claim 1, wherein the low bandgap absorber region is incorporated into a quasi-neutral region of the emitter layer.

11. The semiconductor device of claim 1, wherein the low bandgap absorber region is incorporated into a space-charge region and a quasi-neutral region of a base layer.

12. The semiconductor device of claim 1, wherein the low bandgap absorber region is incorporated into a space-charge region and a quasi-neutral region of an emitter layer.

13. The semiconductor device of claim 1, wherein the at least one subcell comprises more than one low bandgap absorber region.

14. The semiconductor device of claim 1, wherein the subcell further comprises one or more small-lattice-constant strain-compensation regions adjacent to the low bandgap absorber region, wherein a lattice constant of the one or more strain compensation regions is less than the lattice constant of the low bandgap absorber region, wherein strain in the low bandgap absorber region is balanced by strain in the opposite direction by the strain compensation regions, the strain compensation regions having a larger bandgap than the low bandgap absorber region.

15. The semiconductor device of claim 1, wherein the photovoltaic cell is a subcell of a multijunction device.

16. The semiconductor device of claim 1, wherein the photovoltaic cell is a solar cell.

17. The semiconductor device of claim 1, wherein the photovoltaic cell is a subcell of a multijunction solar cell.

18. The semiconductor device of claim 1, further comprising:
    one or more back surface field layers.

19. The semiconductor device of claim 1, wherein the base is a p-type GaInAs base.

20. The semiconductor device of claim 1, wherein the emitter is an n-type GaInAs emitter.

21. The semiconductor device of claim 1, wherein the low bandgap absorber region has a lower bandgap than either the base or the emitter.

22. The semiconductor device of claim 14, wherein the low bandgap absorber region and at least one small-lattice constant strain-compensation region have a lower bandgap than either the base or the emitter.

23. The semiconductor device of claim 1, wherein the base is ordered.

24. The semiconductor device of claim 1, wherein the base is disordered.

25. The semiconductor device of claim 1, wherein the base is both ordered and disordered.

26. The semiconductor device of claim 1, wherein the at least one subcell is a middle subcell of a 3-junction device.

27. The semiconductor device of claim 1, wherein the at least one subcell is a top subcell of a multijunction device.

28. The semiconductor device of claim 1, wherein the at least one subcell is a bottom subcell of a multijunction device.

29. The semiconductor device of claim 1, wherein the at least one subcell is a subcell of a multijunction device positioned between a top subcell and a bottom subcell of the multijunction device.

30. The semiconductor device of claim 1, wherein the semiconductor device further includes a substrate, and one or more additional cells are grown on the opposite side of the substrate from the base layer.

31. The semiconductor device of claim 1, wherein the at least one subcell is grown inverted.

32. The semiconductor device of claim 1, wherein the tensile and compressive regions do not comprise additional chemical elements not present in adjacent layers.

33. The semiconductor device of claim 1 further comprising a substrate.

34. The semiconductor device of claim 33, wherein the substrate is formed from Ge.

35. The semiconductor device of claim 33, wherein the substrate is formed from a binary material.

36. The semiconductor device of claim 35, wherein the binary material is selected from the group consisting of GaAs, GaSb, GaN, InAs, and InSb.

37. The semiconductor device of claim 35, wherein the average lattice constant of the at least one subcell is equal to or within approximately 0.1% of the lattice constant of the binary material.

38. The semiconductor device of claim 1, wherein the compressive regions are formed from GaInAs, and the tensile regions are formed from GaNAs.

39. The semiconductor device of claim 1, wherein the low bandgap absorber region comprises ordered GaInP.

40. A lattice mismatched metamorphic semiconductor device having at least one subcell, the at least one subcell comprising:
a base layer;
an emitter layer in electrical connectivity with the base layer, wherein the base layer and emitter layer form a p-n junction in a photovoltaic cell or other optoelectronic device;
a low bandgap absorber region disposed in either or both of the base layer and emitter layer, wherein the low bandgap absorber region has a higher photogeneration and a lower bandgap than surrounding semiconductor layers;
wherein the low bandgap absorber region forms tensile and compressive regions having alternating smaller and larger lattice constants than that of an average lattice constant of the lattice mismatched metamorphic semiconductor device;
wherein the low bandgap absorber region does not form a quantum well,
wherein the subcell further comprises one or more small-lattice-constant strain-compensation regions adjacent to the low bandgap absorber region, wherein a lattice constant of the one or more strain compensation regions is less than the lattice constant of the low bandgap absorber region, wherein strain in the low bandgap absorber region is balanced by strain in the opposite direction by the strain compensation regions, the strain compensation regions having a larger bandgap than the low bandgap absorber region,
wherein the low bandgap absorber region comprises a 0-dimensional geometric configuration comprising a plurality of point-like structures and wherein the strain compensation regions having a larger bandgap than the low bandgap absorber region encapsulating the 0-dimensional geometric configurations.

* * * * *